United States Patent [19]
Tokunaga et al.

[11] Patent Number: 5,659,184
[45] Date of Patent: Aug. 19, 1997

[54] III-V COMPOUND SEMICONDUCTOR DEVICE WITH A POLYCRYSTALLINE STRUCTURE WITH MINIMUM GRAIN SIZE OF 0.6 μM AND PRINTER AND DISPLAY DEVICE UTILIZING THE SAME

[75] Inventors: Hiroyuki Tokunaga, Kawasaki; Hideshi Kawasaki, Yamato, both of Japan

[73] Assignee: Canon Kabushiki Kaisha, Tokyo, Japan

[21] Appl. No.: 262,772

[22] Filed: Jun. 20, 1994

Related U.S. Application Data

[63] Continuation of Ser. No. 100,191, Aug. 3, 1993, abandoned, which is a continuation of Ser. No. 788,304, Nov. 5, 1991, abandoned.

[30] Foreign Application Priority Data

| Nov. 7, 1990 | [JP] | Japan | 2-303394 |
| Nov. 20, 1990 | [JP] | Japan | 2-316256 |

[51] Int. Cl.$^6$ ................................. H01L 33/00
[52] U.S. Cl. ................ 257/91; 257/99; 257/103; 257/79
[58] Field of Search ............... 257/87, 79, 94, 257/95, 96, 88, 64, 72, 91, 99, 103

[56] References Cited

U.S. PATENT DOCUMENTS

| 4,657,603 | 4/1987 | Kruehler et al. | 148/175 |
| 4,944,811 | 7/1990 | Sukegawa et al. | 437/127 |
| 5,118,365 | 6/1992 | Tokunaga et al. | 437/89 |
| 5,304,820 | 4/1994 | Tokunaga et al. | 257/88 |
| 5,369,290 | 11/1994 | Kawasaki et al. | 257/103 |

FOREIGN PATENT DOCUMENTS

| 0284437 | 9/1980 | European Pat. Off. . | |
| 0180751 | 5/1986 | European Pat. Off. | 257/431 |
| 0285358 | 10/1988 | European Pat. Off. . | |
| 0390549 | 10/1990 | European Pat. Off. . | |
| 60-048384 | 3/1985 | Japan | 257/99 |
| 2125765 | 11/1988 | Japan | 257/88 |
| 1-51677 | 2/1989 | Japan | 257/94 |
| 2-201975 | 8/1990 | Japan | 257/88 |

OTHER PUBLICATIONS

B.K. Bischoff et al., "Selective Groth of GaAs"—IBM Technical Disclosure Bulletin, vol. 16, No. 9, Feb. 1974, New York US, p. 3077.

M. Yamagachi et al., "Efficiency Consideration for Polycrystalline GaAs Thin–Film Solar Cells"; J. of App. Physics, vol. 60, No., 1 Jul. 1, 1986 (NY US pp. 413–417).

J. J. Yang et al, "Electrical properties of polycrystalline GaAs Films", J. of Appl. Phys., vol. 51, No. 7, Jul. 1980, New York US.

O. Paz et al, "Collection of electron–beam generated carriers with presence of a grain boundary or an epitaxial interface", J. Appl. Phys., vol. 61, No. Feb. 15, 1987.

*Primary Examiner*—Minh-Loan Tran
*Attorney, Agent, or Firm*—Fitzpatrick, Cella, Harper & Scinto

[57] ABSTRACT

A III-V compound semiconductor device comprises the use of a compound semiconductor of groups III-V of the periodic table with a polycrystalline structure of an average grain size of 0.6 μm or larger.

5 Claims, 33 Drawing Sheets

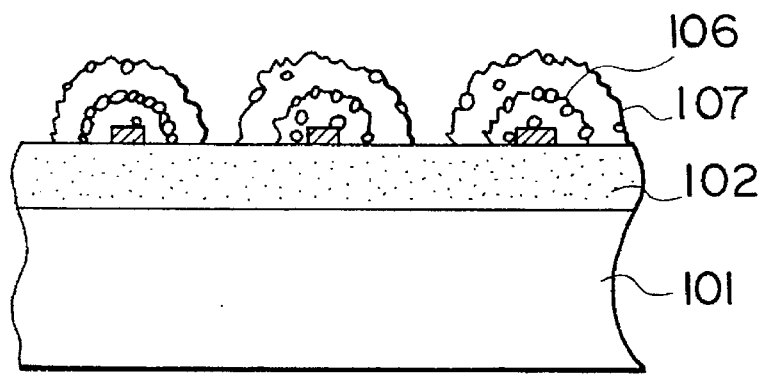
FIG. IF
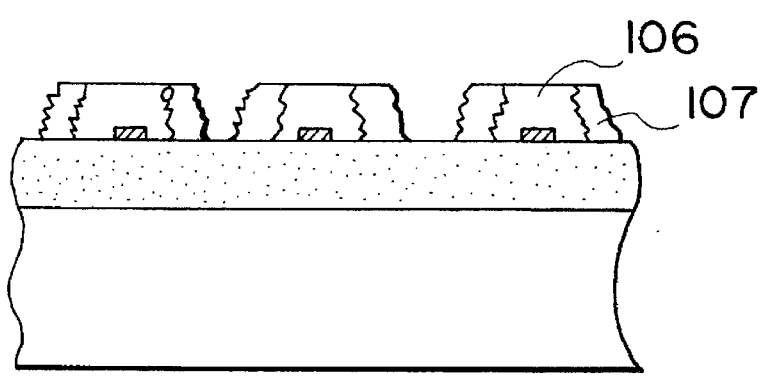
FIG. IG
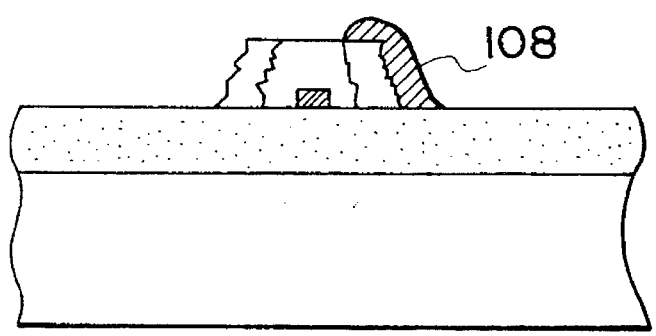
FIG. IH

CALCULATION EXAMPLE OF  :  THE NUMBER OF GRAINS = 10
AVERAGE GRAIN SIZE

THE LENGTH OF CURVE CONNECTING ACTIVE REGIONS = 23 $\mu$m

AVERAGE GRAIN SIZE = $\dfrac{23}{10+1}$

= 2.1 $\mu$m

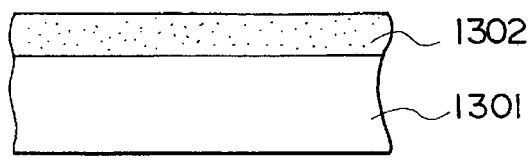
FIG. 13A
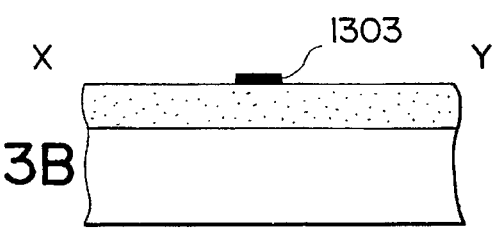
FIG. 13B
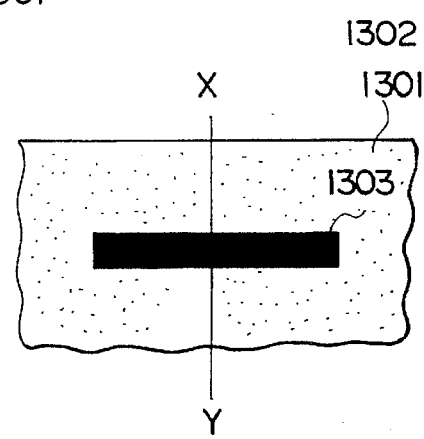
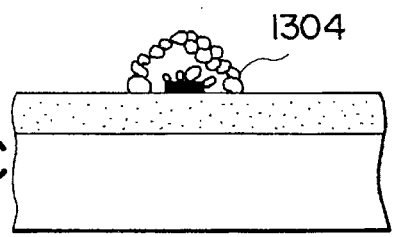
FIG. 13C
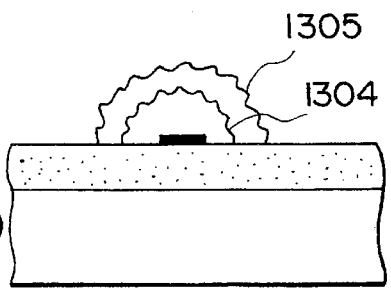
FIG. 13D
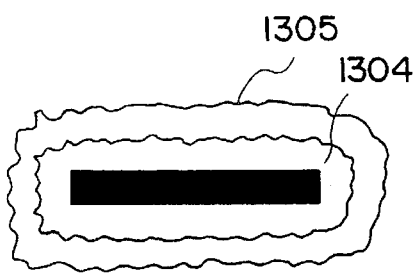

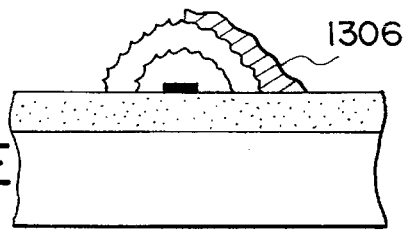
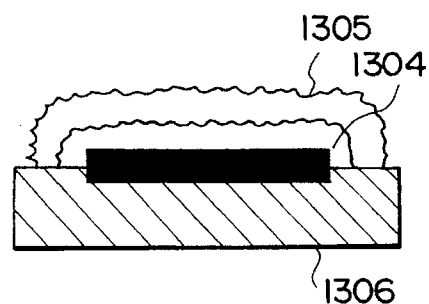
FIG.13E
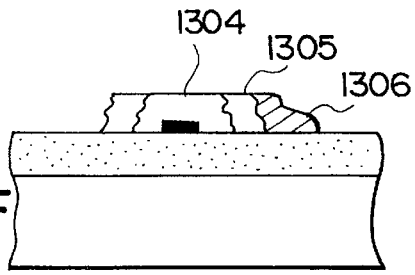
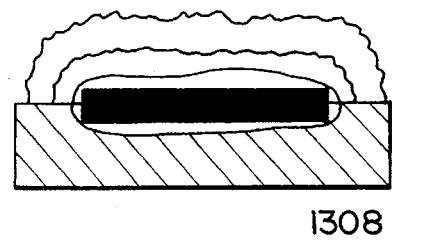
FIG.13F
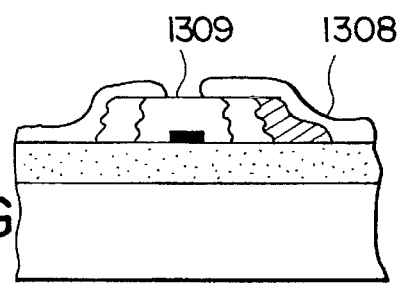
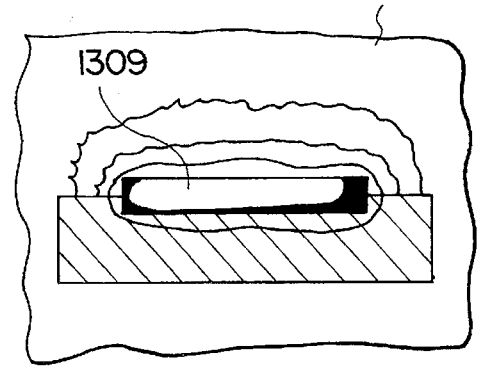
FIG.13G
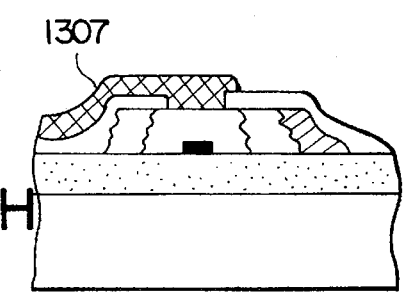
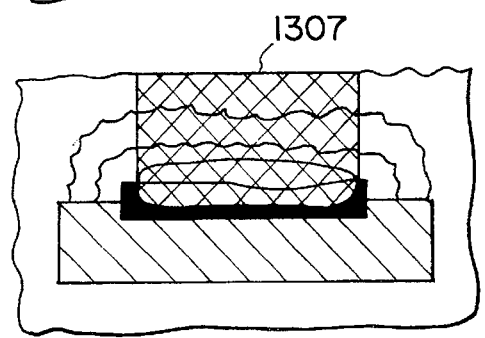
FIG.13H

III-V COMPOUND SEMICONDUCTOR DEVICE WITH A POLYCRYSTALLINE STRUCTURE WITH MINIMUM GRAIN SIZE OF 0.6 μM AND PRINTER AND DISPLAY DEVICE UTILIZING THE SAME

This application is a continuation of application Ser. No. 08/100,191 filed Aug. 3, 1993 now abandoned which is a continuation of application Ser. No. 07/788,304 filed Nov. 5, 1991, now abandoned.

BACKGROUND OF THE INVENTION

1. Field of the Invention

The present invention relates to a method for forming polycrystals of III–V compound semiconductive material, a semiconductor device utilizing said compound semiconductive material, and a printer and a display device utilizing said semiconductor device, and more particularly to the application thereof to a light-emitting device such as a light-emitting diode or an electroluminescence device.

2. Related Background Art

Applications of polycrystalline semiconductors are already known in the following fields. In the materials of group IV of the periodic table, mainly polycrystalline Si is employed in solar cells and thin film transistors. Among polycrystals of groups II–VI, Cd-based materials are employed in thin film transistors and photosensors, and are investigated for applications to solar cells. Also Zn-based materials are used in electroluminescence devices and fluorescent materials, and charcopyrite polycrystals such as $CuInSe_2$ are being investigated for applications to solar cells.

Among the polycrystals of group III–V group, for example, Ga- and In-based materials were once investigated for application to solar cells, but have not been developed to the level of commercialization. The III–V polycrystals appeared in many reports concerning solar cells, but their light emitting characteristic has only been dealt with in a few reports. Salerno, J. P. et al. reported their electron beam luminescence in Cont. Rec. IEEE, vol. 15, p.1174–1178, but no description has been on the characteristic of light-emitting diode utilizing a p-n junction.

Conventionally, display devices utilizing light-emitting diodes have been prepared by forming such light-emitting diodes (LED) on a monocrystalline wafer, then cutting said LED's individually or in a group of several diodes, and adhering such diodes on a supporting substrate in the form of a lamp or a display device for characters or numerals. Also, a hybrid device including plural LED's as an LED display device of a large area has been array head, but the use of such large-area LED display has been limited because of the high cost.

In order to overcome the limitation in the display area of the LED display, the present inventors already proposed, in the EP Publication No. 284437A2, a selective nucleation method for forming III–V compound single crystal of a large area. This method consists of employing a substrate having a non-nucleation surface of a low nucleation density for the III–V compound crystals and a nucleation surface of an amorphous material positioned adjacent to said non-nucleation surface, and having a sufficiently small area for allowing crystal growth from a single nucleus and a nucleation density larger than that of said non-nucleation surface, and growing III–V compound single crystal from said single nucleus, eventually beyond the nucleation surface over the non-nucleation surface.

Also the present inventors disclosed, in the EP Publication No. 285358A2, formation of an LED on a non-monocrystalline substrate, by switching the crystal forming conditions in the course of the above-mentioned single crystal formation, thus forming a p-n junction area therein.

The LED array head as described in the Japanese Patent Application Laid-Open No. 60-48384, is prepared by adhering LED array of 1–2 cm each in length, prepared on a monocrystalline compound semiconductor substrate, in a linear arrangement on a supporting substrate.

Since such LED array head emits light principally in a direction perpendicular to the monocrystalline substrate, the supporting substrate 1902 is supported, as shown in FIG. 19, parallel to the surface of a photosensitive drum 1901. For this reason, considerable space has to be reserved around the photosensitive drum for installing the LED array head.

Japanese Patent Application Laid-Open No. 2-125765 proposes a configuration of arranging the monocrystalline substrate in such a manner that the light emitting direction becomes parallel to the supporting substrate and maintaining said supporting substrate in a direction perpendicular to the surface of the photosensitive drum. However, mounting the substrates requires arranging and adhering a plurality of small monocrystalline compound semiconductor substrate chips on the supporting substrate, and aligning the optical axis. Consequently a long time is required for mounting and there is often encountered unevenness in the pitch of the light-emitting elements and in the light intensity, at the junctions of such chips.

For overcoming such drawbacks, the present inventors proposed the semiconductor device utilizing the above-mentioned selective nucleation method.

The above-mentioned selective nucleation method enables to obtain a large-area III–V single crystal on a non-monocrystalline substrate, but there may sometimes be formed polycrystals or a void on the nucleation site. The preparation of LED elements on such substrate may show insufficient uniformity, since such polycrystals result in a lowered light emission intensity while such void gives rise to total lack of light emission. Besides, even the single crystal sometimes exhibits abnormal growth, assuming an oblong form with a strong anisotropy in the growth, thus hindering the device preparing process such as electrode formation. Furthermore, the selective nucleation method is associated with a contradicting property that the crystal occupancy rate is deteriorated under a crystal growth condition providing a high monocrystallinity, and vice versa.

Furthermore, since the above-mentioned light-emitting elements employing single crystal or polycrystals emit light in a direction perpendicular to the substrate, they require a considerable space around the photosensitive drum when they are employed as an LED array head in an electrophotographic printer. Also a planarization step, involved in the device preparing process, applies a physical impact onto the substrate surface, thus eventually causing peeling of the semiconductor crystal.

SUMMARY OF THE INVENTION

In consideration of the foregoing, an object of the present invention is to provide a III–V compound semiconductor device free from the above-mentioned drawbacks, a printer head and a display device employing such semiconductor device, and a method for producing said semiconductor device.

Another object of the present invention is to provide a III–V compound semiconductor device formed in self-aligned and isolated manner on arbitrary substrates including insulating ones, and a method for producing such semiconductor device.

BRIEF DESCRIPTION OF THE DRAWINGS

FIGS. 13A to 13H are schematic views showing the process for producing an LED of the present invention, employing GaAs;

DETAILED DESCRIPTION OF THE PREFERRED EMBODIMENTS

Figure 1A:
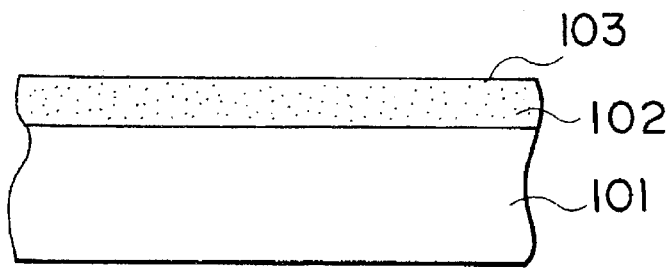
FIGS. 1A to 1T are schematic views showing the method for producing an LED, as an example of the III–V compound semiconductor device of the present invention.
Figure 1B:
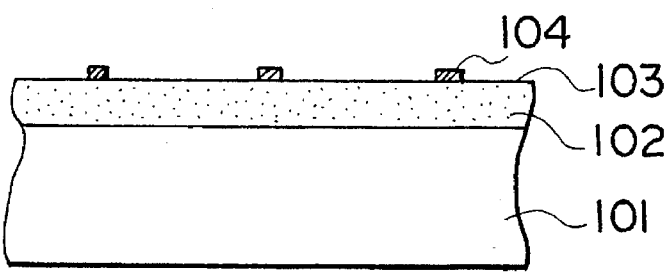
Figure 1C:
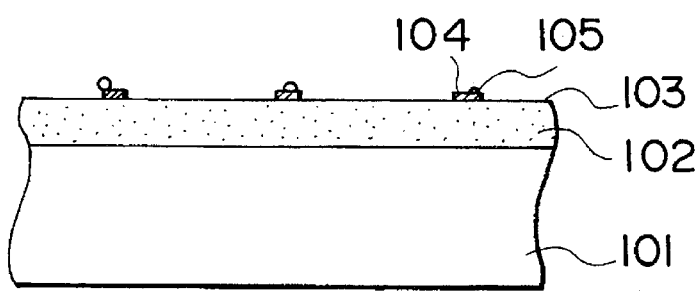
Figure 1D:
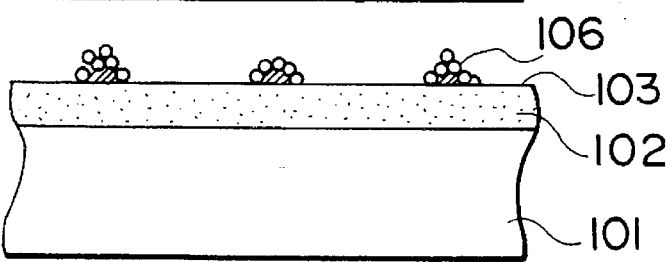
Figure 1E:
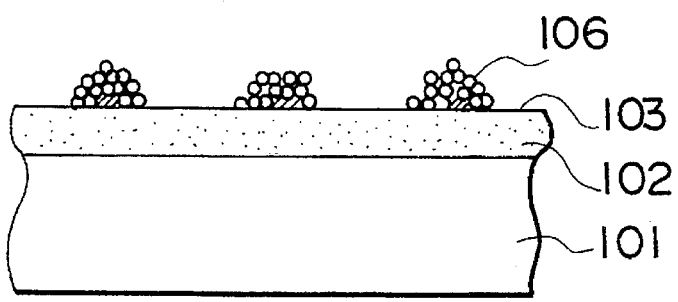
Figure 1I:
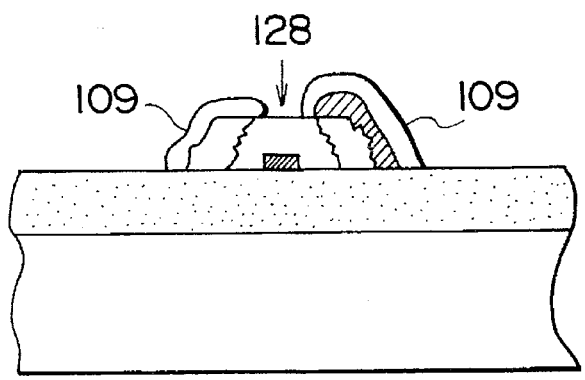
Figure 1J:
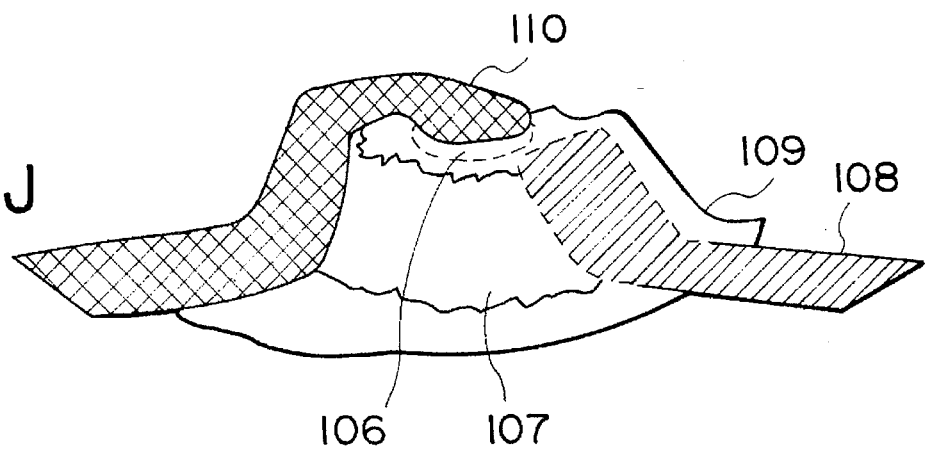

Preferred forms of the III–V compounds semiconductor device of the present invention can be represented as follows.

The III–V compound semiconductor device of the present invention is featured by the use of a III–V compound semiconductor of a polycrystalline structure with an average grain size of 0.6 µm or larger.

The III–V compound semiconductor device of the present invention is also featured by:

a substrate having a surface composed of a non-monocrystalline material;

a crystalline area of a first conductive type formed in a desired position on said substrate and composed of a III–V compound semiconductor; and a crystalline area of a second conductive type surrounding said crystalline area of the first conductive type and composed of a III–V compound semiconductor;

wherein said crystalline area of the first conductive type has an exposed area.

Also the preferred forms of the method for producing the III–V compound semiconductor device of the present invention can be represented as follows.

The method for producing the III–V compound semiconductor device of the present invention is featured by applying a crystal growing process to a substrate having a free surface, on which a non-nucleation surface with a low nucleation density and a nucleation surface having a nucleation density larger than that of said non-nucleation surface and patterned to an optimum area for generating plural nuclei by crystal growth with an average crystal grain size of 0.6 µm are arranged in mutually adjacent manner, thereby forming III–V compound semiconductor with polycrystalline structure with an average grain size of 0.6 µm or larger, starting from said nuclei.

Also the method for producing the III–V compound semiconductor device of the present invention is featured by a step for forming a crystalline area of a first conductive type and a crystalline area of a second conductive type, composed of a III–V compound semiconductor, in desired positions on a substrate having a non-monocrystalline surface; a step for forming a first electrode in a part of said crystalline area of the second conductive type; a step for eliminating the crystalline area of the second conductive type, excluding the area of formation of said first electrode, thereby exposing the crystalline area of the first conductive type; and a step for forming a second electrode in the thus exposed area.

The method of the present invention, for producing the III–V compound semiconductor device, enables to form a semiconductor device, such as LED, with a satisfactory yield, in an arbitrary position on an arbitrary substrate. Thus a large-sized monolithic display device or a one-dimensional LED array can be easily produced. Also the present invention permits dispensing with the device isolation step, since the semiconductor device such as LED can be formed in self-aligned and isolated manner on an insulating substrate. Also it is possible to achieve an improvement in the breakdown voltage of the device.

Furthermore, the present invention can significantly reduce the cost of semiconductor device manufacture, since expensive monocrystalline wafer of compound semiconductor is not employed.

Furthermore, when the semiconductor device of the present invention is employed in an LED array head, the space around the photosensitive drum need not be wide, and the mounting of the LED array on the supporting substrate can be achieved with only one optical alignment. Also the method of the present invention allows electrode formation without the planarization step, so that crystal peeling that may occur at the planarization step can be avoided.

According to the present invention, since the crystal formed on the substrate has a very low probability of mixed presence of single crystal and polycrystals and of voids on the nucleation sites, the characteristics of the semiconductor device are extremely stable. For example, when such semiconductor device is applied to a light-emitting device, the uniformity of the light-emitting characteristics is significantly improved in comparison with those of the conventional devices.

In the following, in order to facilitate the understanding of details of the present invention, there will be explained the course of research which has lead to the present invention.
[Experiments]

At first explanation will be given regarding the control method on crystal grain size and the light-emitting characteristics of III-V compound polycrystals.

Figure 2:
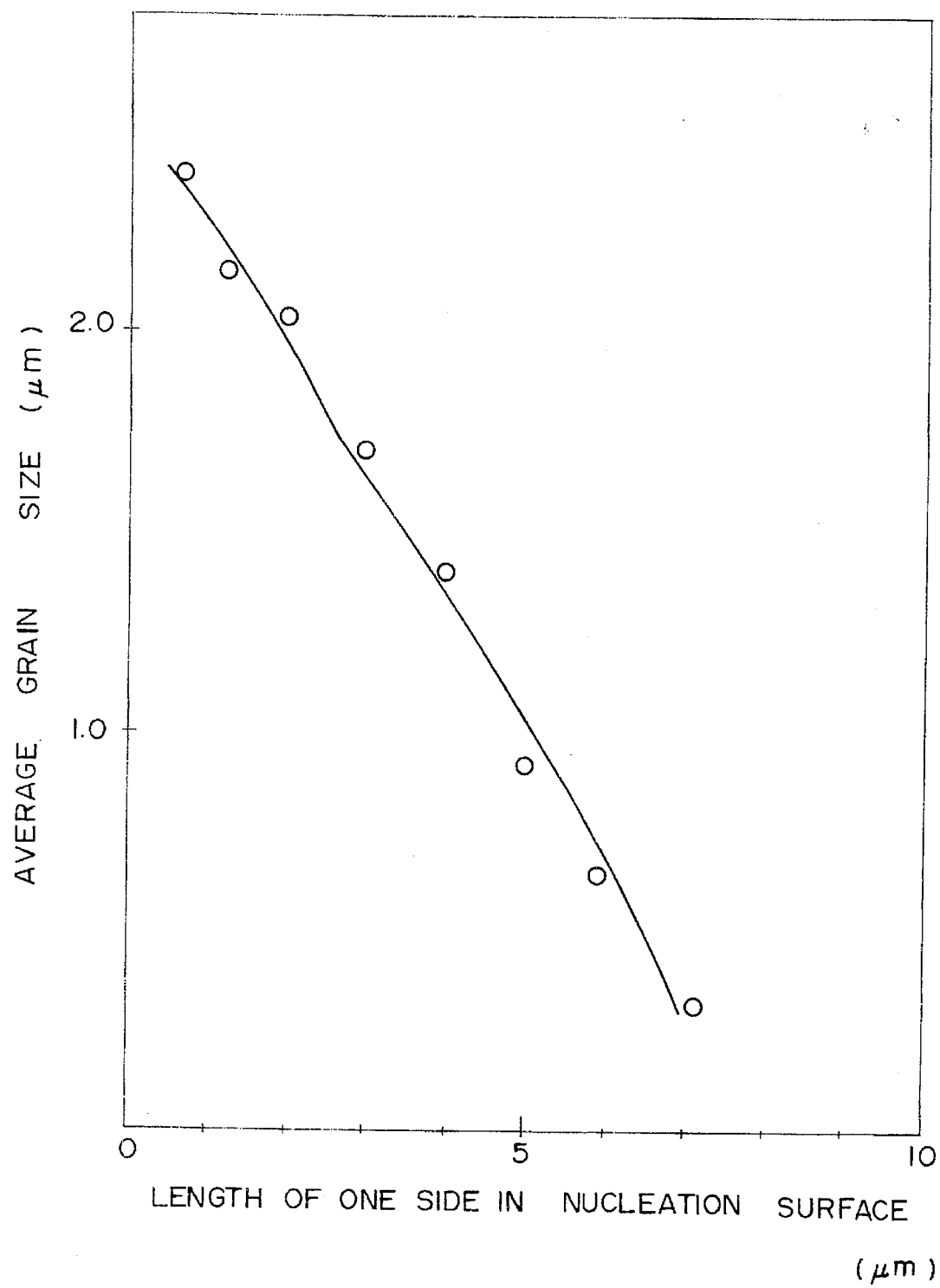
FIG. 2 is a chart showing the relationship between the size of nucleation surface and the average grain size of polycrystals in GaAs selective deposition.

FIG. 2 shows the relationship between the size of a nucleation surface (square) and the average grain size of polycrystals when GaAs polycrystals are selectively deposited by MOCVD method.

The average grain size is observed at a position of 2-3 μm from the surface of the crystal island. This is because, in the preparation of LED, the p-n junction is formed about the same distance of 2-3 μm from the surface, and the light emission intensity is most strongly affected by the crystallinity in this area. The crystal growth was conducted under the following conditions.

| Crystal growth conditions | |
| --- | --- |
| Trimethyl gallium (TMG) | $2.4 \times 10^{-5}$ mol/min. |
| Arsine (AsH$_3$) | $1.4 \times 10^{-3}$ mol/min. |
| Reaction pressure | 20 Torr |
| Substrate temperature | 775 °C. |
| Growth time | 60 min. |
| Diluting gas (H$_2$) flow rate | 0.45 mol/min (10 l/min) |
| Etching gas (HCl) flow rate | $2.2 \times 10^{-5}$ mol/min. |
| Nucleation surface | poly Si (grain size 500Å) |
| Non-nucleation surface | SiO$_2$ |
| Crystal island diameter | 20 μm |

Figure 3:
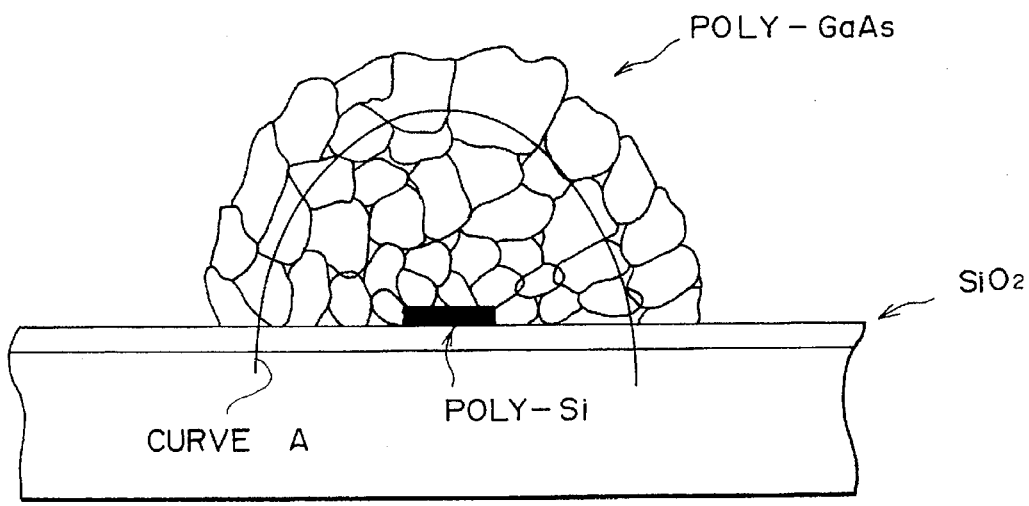
FIG. 3 is a schematic view showing the method of evaluating the crystal grain size.

The average grain size was determined in the following manner, as illustrated in FIG. 3. An island of selectively deposited GaAs polycrystals was surfacially covered with epoxy resin, then ground with diamond paste to a thickness of about 60 μm in a cross-sectional direction perpendicular to the substrate surface, further thinned to about 20 μm by ion milling, and observed under a TEM (transmission electron microscope). The average grain size was determined by drawing a semi-circular line A at a position of about 2 μm from the surface of the crystals, and dividing the length of the curve on the cross section by the number of grain boundaries crossing said curve plus one. In this calculation, small grains generated between the larger grains and smaller than 10% of the largest grain are excluded from the counting.

The TEM observation revealed that the grain size was somewhat smaller within a range of about 2-3 μm from the nucleation surface, and was approximately uniform outside said range.

On the other hand, as will be apparent from FIG. 2, the average grain size of crystals grew larger as the nucleation surface becomes smaller.

These facts can be interpreted as follows. The nucleation density is determined by the material constituting the nucleation surface and the crystal growing conditions. The number of nuclei decreases as the size of the nucleation surface becomes smaller, and the size of crystal grain increases since the amount of raw material gas supplied per unit area or the total volume of crystals growing by consuming such raw material gas is constant if the density of arrangement of nucleation surfaces is at a certain high level.

In the following there will be explained the light emission characteristics, investigated by an LED prepared with GaAs polycrystals of which grain size was controlled by the size of nucleation surface. The cyrstal growth was conducted under following conditions.

| Crystal growth conditions | |
| --- | --- |
| Trimethyl gallium (TMG) | $3.0 \times 10^{-5}$ mol/min. |
| Arsine (AsH$_3$) | $2.0 \times 10^{-3}$ mol/min. |
| Reaction pressure | 20 Torr |
| Substrate temperature | 775 °C. |
| Growth time | 60 min. |
| Diluting gas (H$_2$) flow rate | 0.45 mol/min. |
| Etching gas (HCl) flow rate | $2.2 \times 10^{-5}$ mol/min. |
| Doping gas p-type (DEZ) | $6 \times 10^{-5}$ mol/min. |
| n-type (SiH$_4$) | $5 \times 10^{-7}$ mol/min. |
| Nucleation surface | poly Si |
| Non-nucleation surface | SiO$_2$ |

Figure 4:
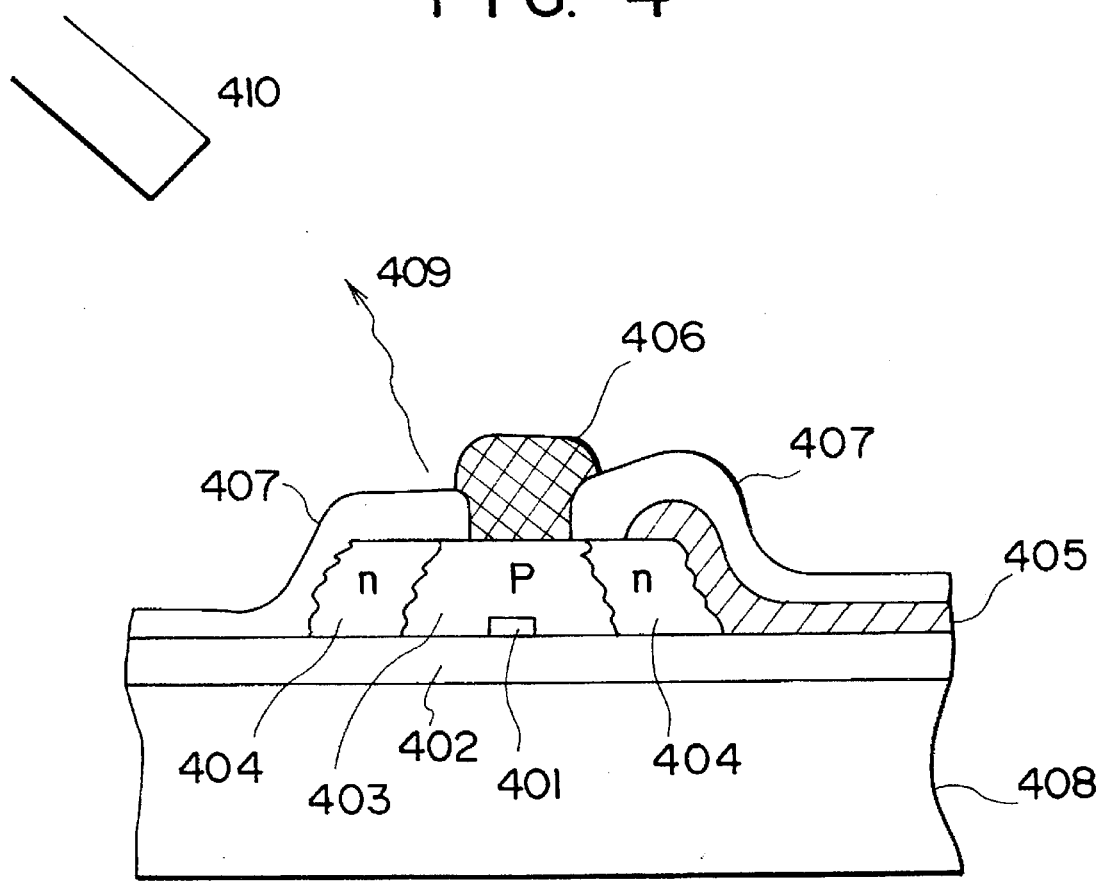
FIG. 4 is a schematic view of an LED formed according to the present invention.

FIG. 4 is a schematic cross-sectional view of the LED, of which detailed preparation will be explained later in the examples. In short, the device was prepared by growing p-GaAs polycrystals 403 and n-GaAs polycrystals 404 in continuation on a polysilicon nucleation surface 401, and, after planarization, forming electrodes 405, 406 across an insulation film 407. The light intensity was investigated by measuring the light 409, generated from the junction, with a photomultiplier 410. Regardless of the grain size, all the polycrystalline GaAs LED's showed light emission spectra with a peak wavelength around 880 nm in the infrared region, and the light emission intensity was therefore compared at 880 nm.

Figure 5:
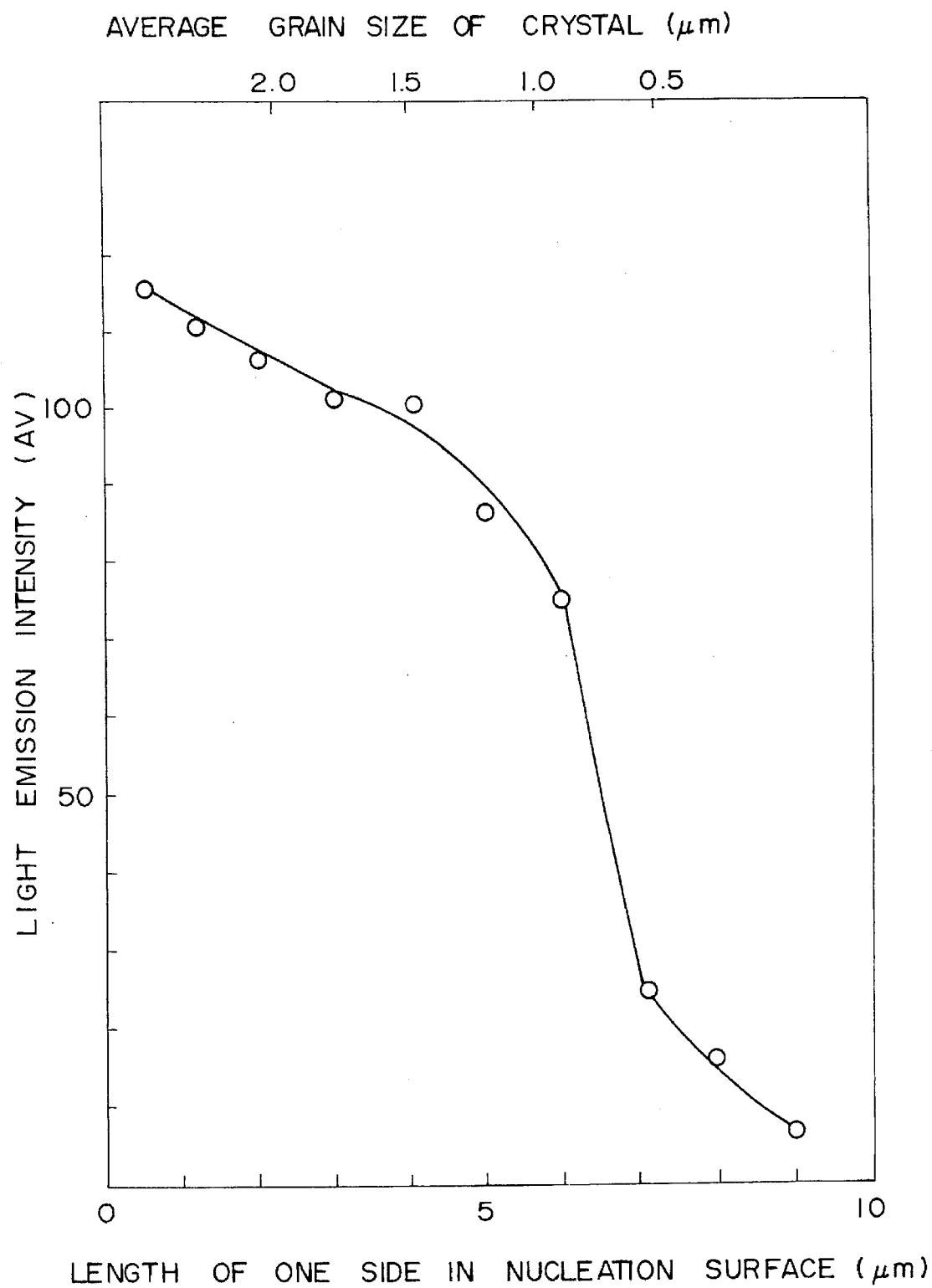
FIG. 5 is a chart showing the relationship between the size of nucleation surface and the light emission intensity in the LED of the present invention.

FIG. 5 shows the relationship between the size of nucleation surface (average grain size of crystals) and the light emission intensity represented by arbitrary units.

It will be understood that the light emission intensity of LED decreases with the increase in the size of nucleation surface (or decrease in the crystal grain size), with a particularly marked loss in the light emission intensity within a range of 5-6 μm of the size of nucleation surface (or 0.8-0.6 μm of the grain size).

This phenomenon is probably ascribable to a fact that the decrease in grain size increases the grain boundaries, and the recombinations at such boundaries reduce the light emission efficiency. O. Paz et al. (J. Appl. Phys. 61(4) 15, 1987 p.1537 and M. Yamaguchi et al. (J. Appl. Phys. 60(1) 1, 1986 p.413) reported similar tendencies in the investigations of recombination rate of carrier and in the diffusion length of minority carriers.

In the following the relation among the size and density of nucleation surfaces, the rate of polycrystalline island voids lacking crystal growth on nucleation sites, and the rate of abnormal nucleus generation on non-nucleation surface is explained.

Figure 6:
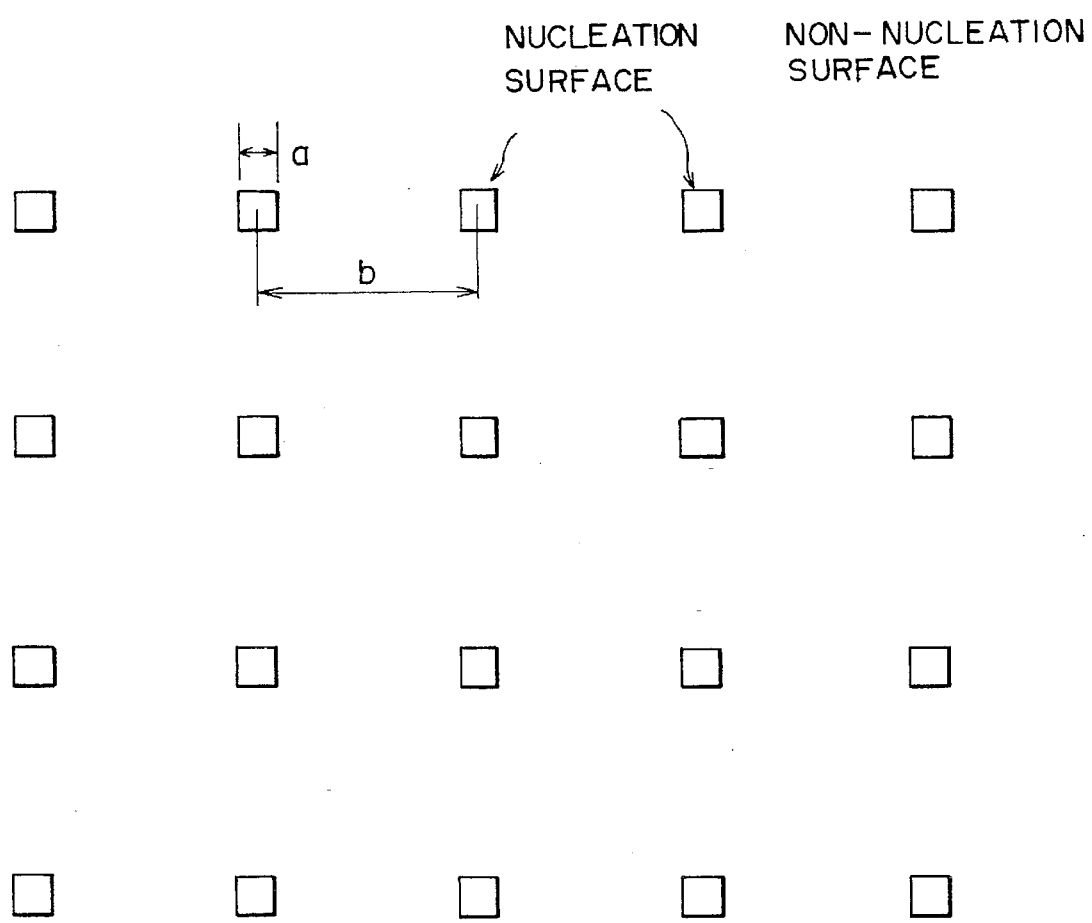
FIG. 6 is a schematic view showing the arrangement of nucleation surfaces and non-nucleation surface in a substrate for selective deposition, employed in the present invention.
Figure 7:
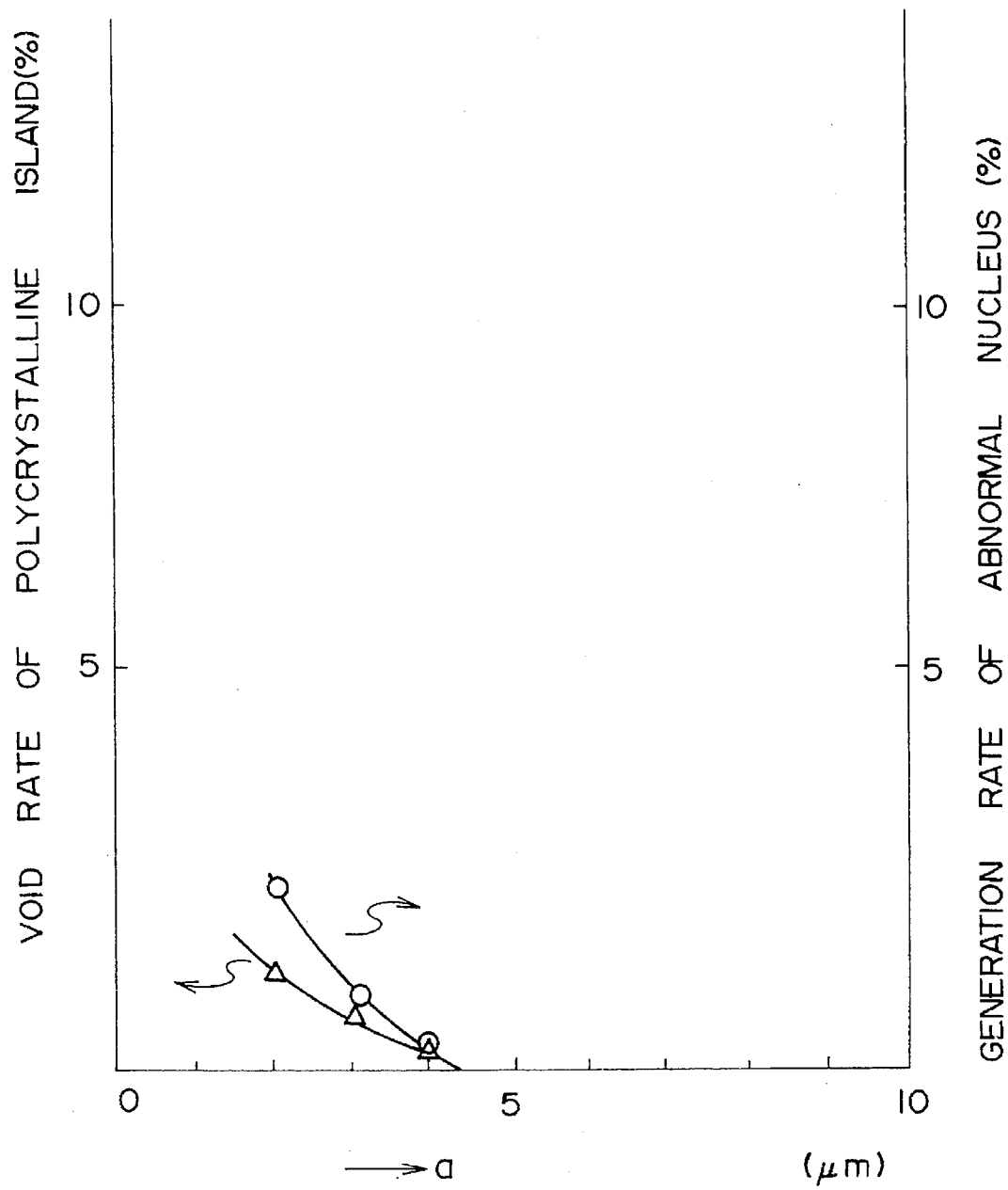
FIG. 7 is a chart showing the relationship among the size of nucleation surface, rate of polycrystalline island loss and rate of abnormal nucleus generation, in the selective deposition of the present invention.

FIG. 6 is a schematic view of a substrate employed for the experiments of selective deposition. The nucleation surfaces were square-shaped, with a side a, and were arranged in a lattice pattern, with a pitch b between the centers, on a non-nucleation surface. FIG. 7 shows the void rate and the abnormal nucleation rate as a function of a, with b=50 μm, when the nucleation surface and the non-nucleation surface were respectively composed of poly Si and SiO$_2$. The crystal growth conditions were same as those in the case of FIG. 4.

The void rate and the abnormal nucleation rate are both reduced with the increase of a. However, as the light emission efficiency of LED deteriorates with the increase of a as previously explained, an optimum value is determined according to the device specification.

Figure 8:
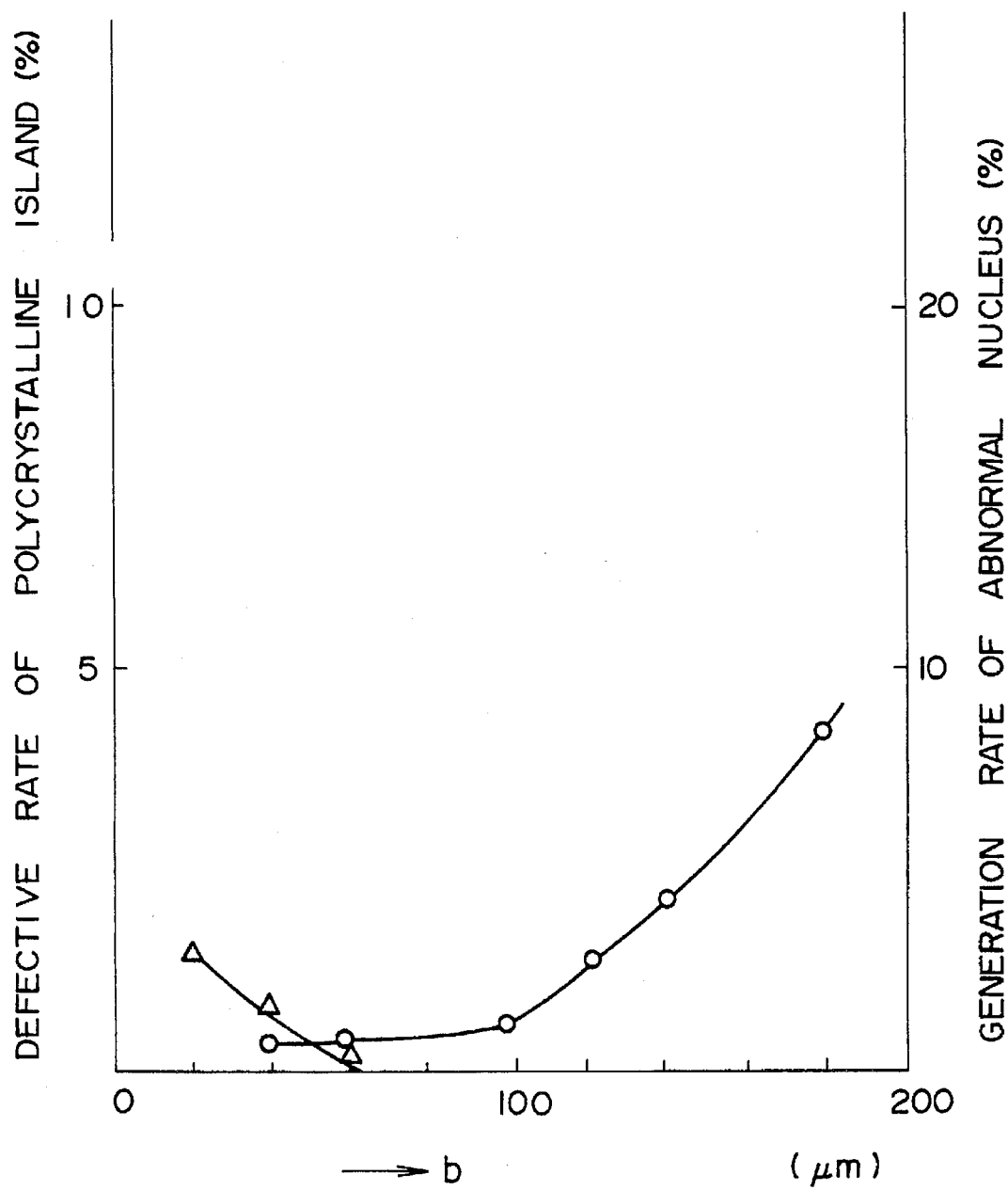
FIG. 8 is a chart showing the relationship among the density of nucleation surface rate of polycrystalline island loss and rate of abnormal nucleus generation, in the selective deposition of the present invention.

FIG. 8 shows the void rate and the abnormal nucleation rate as function of b, with a=3 μm, under same crystal growing conditions.

The void rate is reduced with the increase of b, but the abnormal nucleation increases rapidly when b exceeds 100 μm. This result indicates that, in consideration of possible troubles such as short-circuiting in the electrode wirings, dummy nucleations surfaces have to be prepared even in the areas where the light-emitting devices are not formed, in order to avoid unexpected abnormal nuclei generation.

[Embodiments]

The III–V compound semiconductors of the present invention are not limited to compounds of two elements, but also include mixed crystal compounds of III–V groups of the periodic table, involving three or more elements.

In the following there will be explained embodiments of the present invention, with reference to the attached drawings.

Following description will refer to FIGS. 1A to 1J which are schematic views, showing steps of producing an LED by effecting selective nucleation and growing polycrystals of III–V compound semiconductor with controlled grain size, according to the method of the present invention.

(A) On a substrate material 101 (for example a ceramic material such as $Al_2O_3$, AlN or BN; amorphous quartz; high-melting glass; or high-melting metal such as W or Mo), a thin film 102 of a material of low nucleation density (for example non-monocrystalline $SiO_2$ or $Si_3N_4$) is deposited to constitute a non-nucleation surface 103.

Figure 1K:
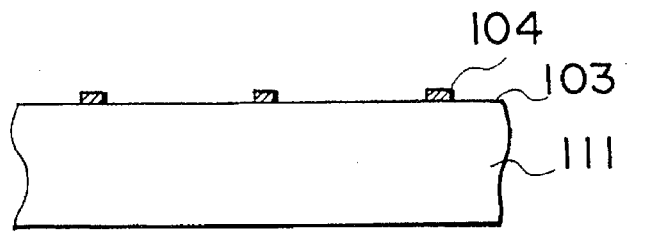

Said thin film may be formed by CVD, sputtering, evaporation or coating involving a dispersion medium (FIG. 1A). Also there may be employed a substrate 111 of a material of low nucleation density, as shown in FIG. 1K, instead of the substrate 101.

Figure 1L:
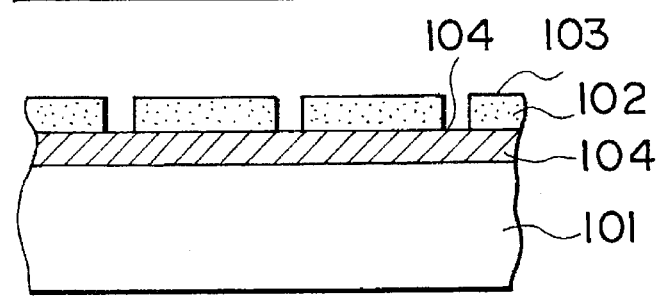
Figure 1M:
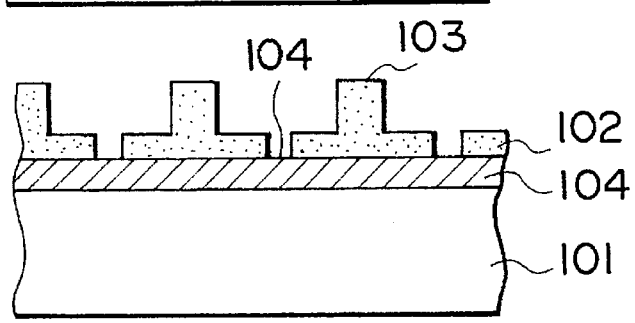

(B) Nucleation surfaces 104 are obtained by forming a material of a nucleation density higher than that of the non-nucleation surface (for example non-monocrystalline polysilicon, AlN, $Al_2O_3$, $Ta_2O_5$, TiN, $TiO_2$, $WO_3$, etc.) in small areas (generally in squares of a size of 1–8 μm, preferably 1–6 μm and most preferably 1–3 μm, or in stripes with a small width which is generally 1–8 μm, preferably 1–6 μm and most preferably 1–3 μm). It is also possible, instead of fine patterning of the thin film, to deposit a thin film 104 of a material of a high nucleation density on a substrate, then to deposit thereon a thin film of a material of a low nucleation density thereby constituting the non-nucleation surface, and to open small windows therein by etching to exposure the nucleation surface 104 as shown in FIG. 1L, or, as shown in FIG. 1M, to form recesses in a film 104 of a material of a low nucleation density and opening small windows in the bottom of said recesses thereby exposing the nucleation surface in the latter case, the crystal growth is conducted in said recesses.

Figure 1N:
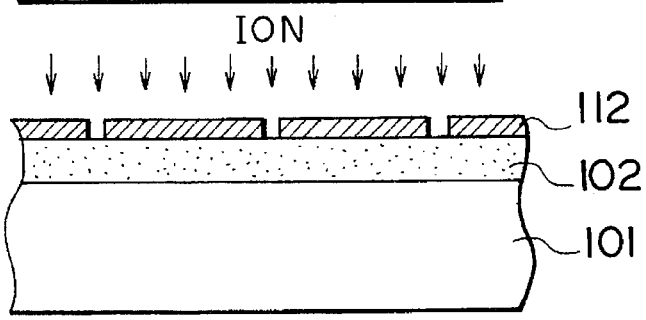
Figure 1O:
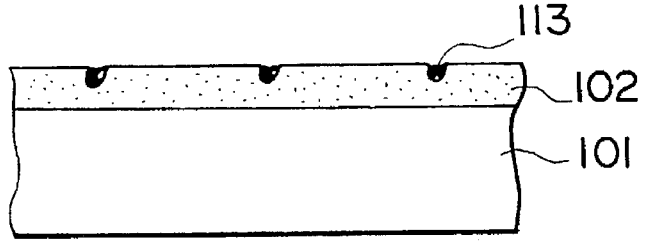

It is furthermore possible, as shown in FIGS. 1N and 1O, to form a resist layer 112 except small areas, and to implant ions such as As, Ti, Ga, Al or In into a thin film 102 of a material of a low nucleation density, thereby forming ion implanted areas 113 of a high nucleation density.

The distance between the nucleation surface is generally in a range of 20–200 μm, preferably 30–140 μm and most preferably 40–100 μm.

(C) On the substrate thus prepared, a III–V compound (such as GaAs, GaAlAs, GaP, GaAsP, InP or GaInAsP) is grown by a MOCVD method to be explained later.

(D) The nuclei grow with time, and new nuclei are generated, whereby the nucleation surfaces become covered with polycrystals 106. Then the polycrystals spread onto the non-nucleation surface 103. In this state, doping gas of n- or p-type is added to control the carrier concentration at a level of $10^{18}$ $cm^{-3}$.

(E) The n- or p-type polycrystalline layer 106 is grown to a desired size. Said layer grows in a semi-spherical shape, around the nucleation surface 104.

(F) Then the doping gas is changed to grow, on the above-mentioned n- or p-type layer 106, a p- or n-type layer 107 of the opposite conductive type in a concentric spherical shape to a desired size. The external diameter of the polycrystalline compound semiconductor island 106–107 of semi-spherical shape is generally in a range of 10–120 μm, preferably 15–80 μm and most preferably 20–60 μm.

(G) The upper surface of thus grown polycrystal island 106–107 is planarized by mechanical grinding to partially expose the internal layer 106.

(H) A metal electrode 108, in ohmic contact with the external layer 107, is formed by photolithographic patterning.

(I) An insulation film 109 is deposited, and is photolithographically patterned to form a contact hole 128 reaching the internal layer 106.

(J) A metal electrode 110, in ohmic contact with the internal layer 106, is formed by a photolithographic process.

Subsequently, annealing is conducted in inert gas such as Ar, at a predetermined temperature (generally in a range of 300°–600° C., preferably 400°–550° C. and most preferably 450°–500° C.) to optimize the contact resistances of the electrodes.

A voltage application between the electrodes 108, 110 induces a charge injection between the layers 106, 107, whereby the device functions as an LED.

The light may be taken out from the lower part of the device, through the substrate 101 if it is composed of a transparent material such as $SiO_2$. Also the light may be taken out from the upper part of the device, by suitable selection of the forms of the electrodes 109, 110.

Figure 1P:
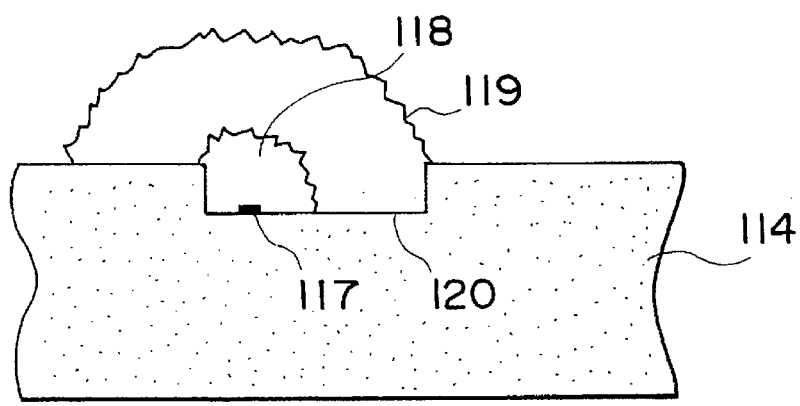
Figure 1Q:
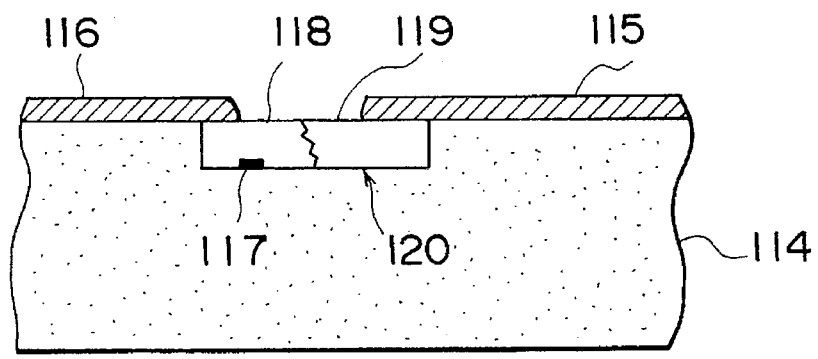

In addition to the above-explained device structure with concentric spherical polycrystalline island grown from the nucleation surface, there may also be adopted a structure obtained, as shown in FIG. 1P, by forming a recess 120 on a substrate 114, positioning a nucleation surface 117 in an off-center position therein, growing polycrystals of p-n or n-p types 118, 119 in continuation, then planarizing said polycrystals as shown in FIG. 1Q and forming electrodes 115, 116 on the polycrystal layers of respective conductive types.

Figure 1R:
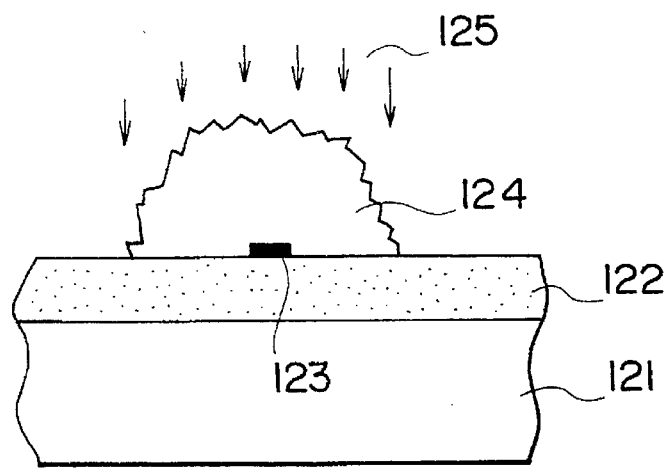
Figure 1S:
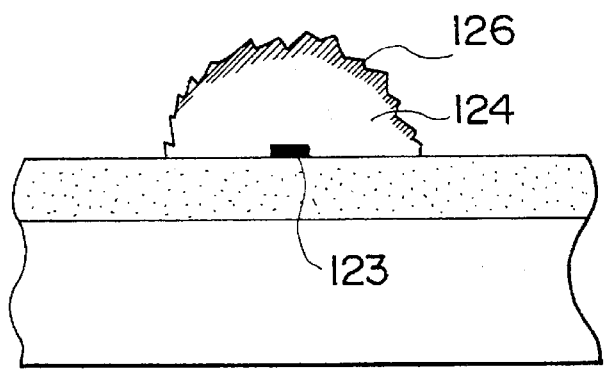
Figure 1T:
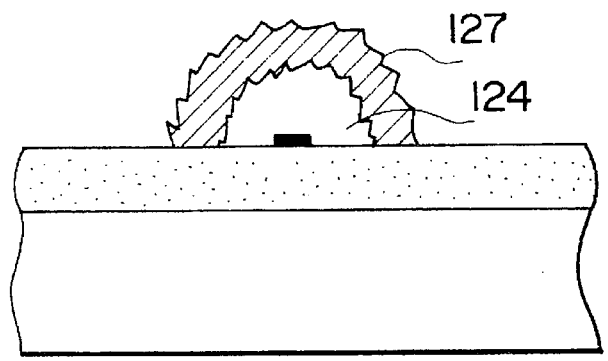

The p-n junction may also be formed, in addition to the doping gas switching in the course of crystal growth, as shown in FIGS. 1R to 1T by forming a layer 124 of n or p conductive type, then implanting ions 125 of the opposite conductive type and forming a layer 127 of said opposite conductive type of subsequent diffusion.

In the following there will given a detailed explanation on the MOCVD method mentioned before in relation to FIG. 1C.

Figure 9:
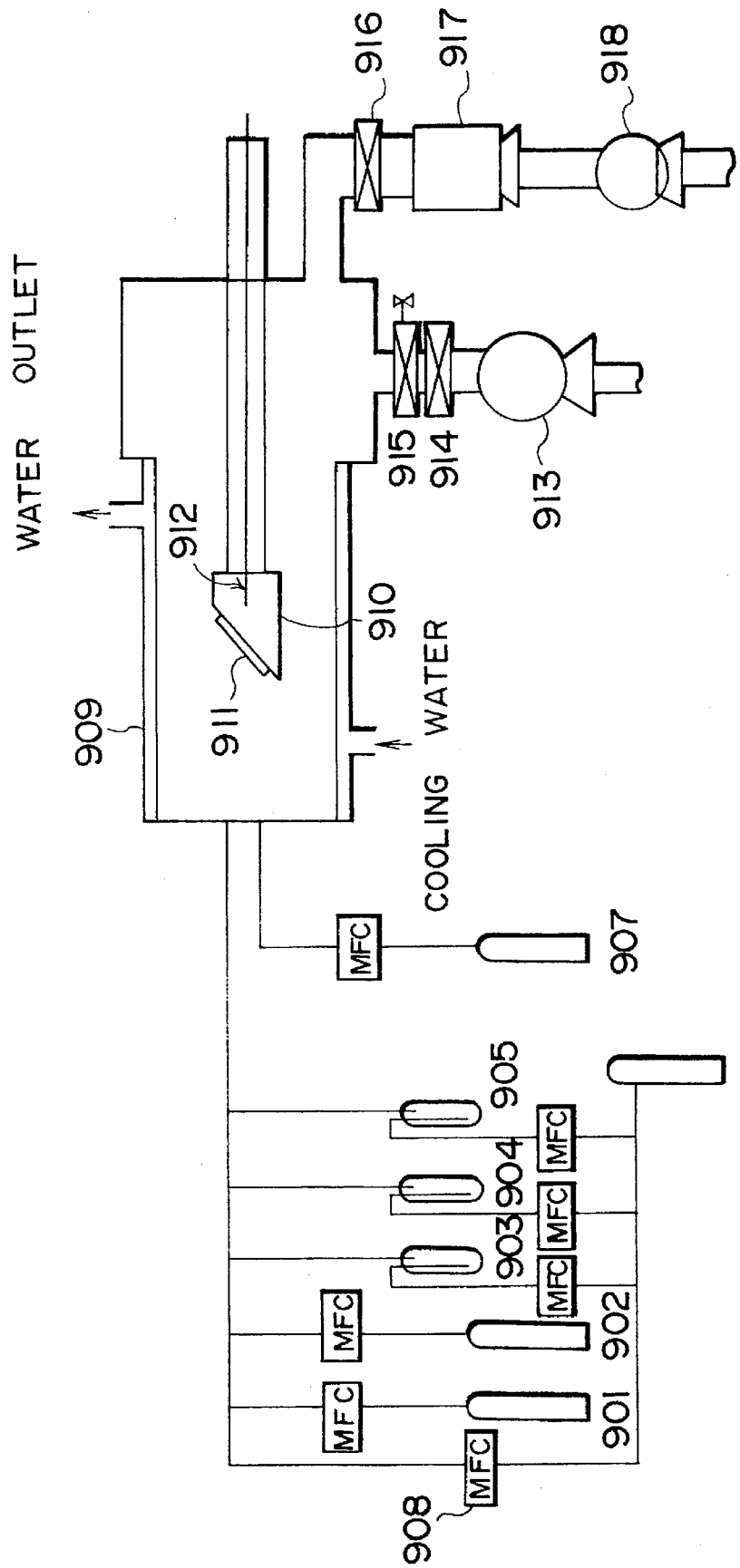
FIG. 9 is a schematic view of an example of the MOCVD apparatus employable in the present invention.
Figure 10A:
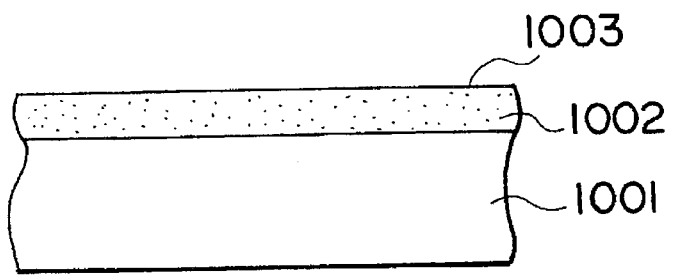
FIGS. 10A to 10J are schematic views showing the process for producing an LED of the present invention, employing GaAlAs.
Figure 10B:
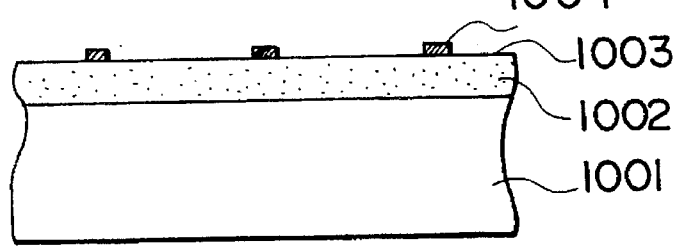
Figure 10C:
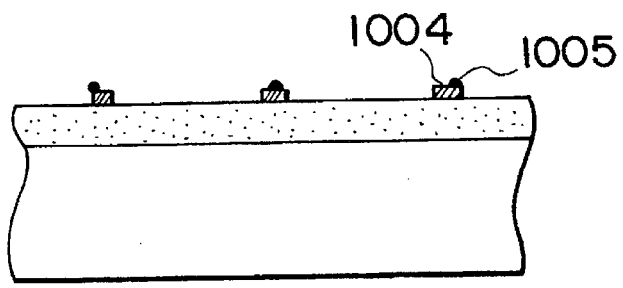
Figure 10D:
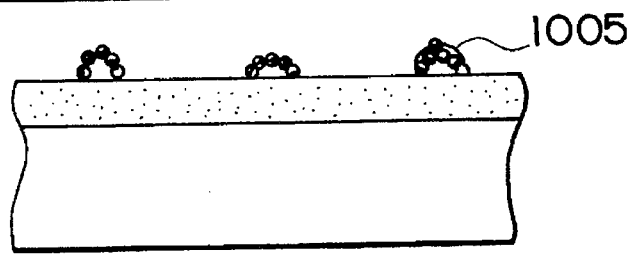
Figure 10E:
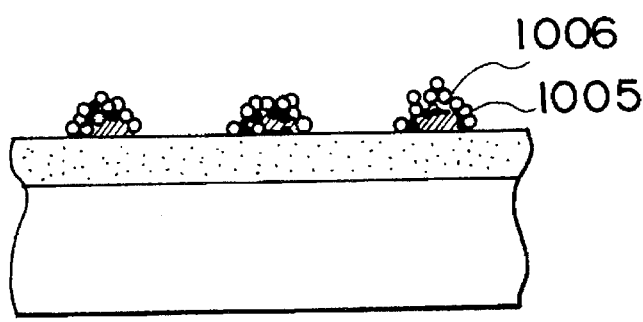
Figure 10F:
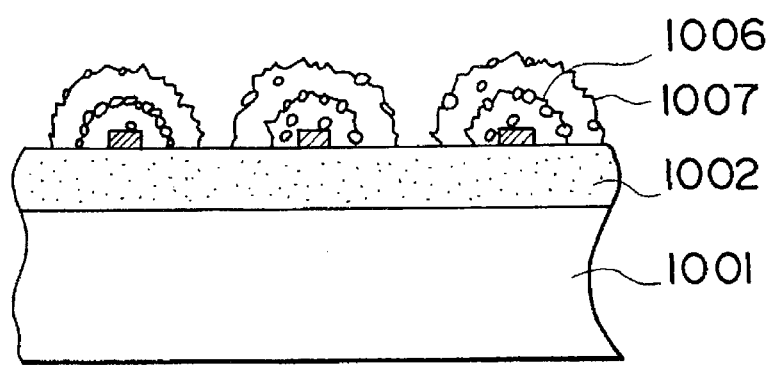
Figure 10G:
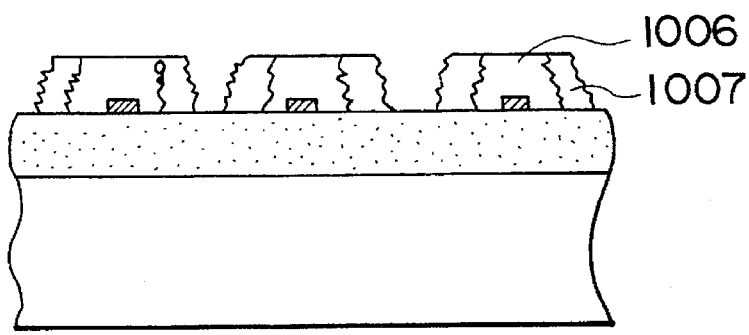
Figure 10H:
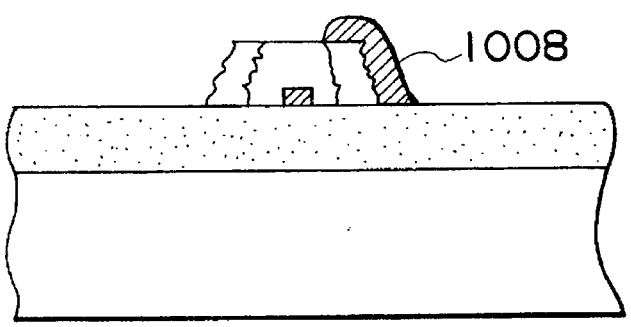
Figure 10:
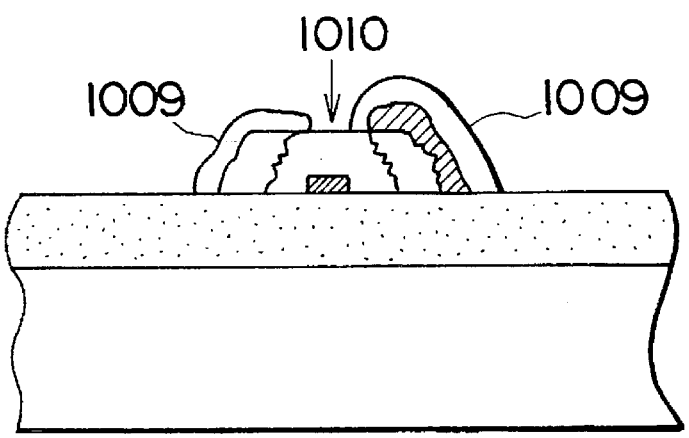
Figure 10:
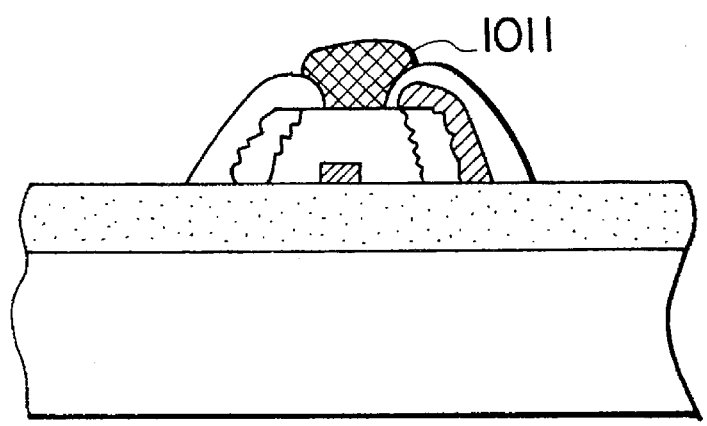
Figure 11A:
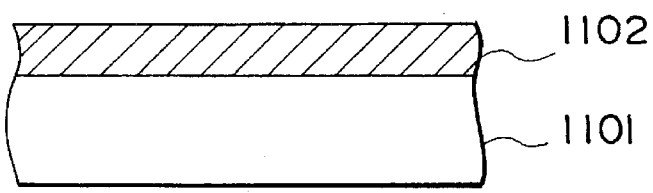
FIGS. 11A to 11J are schematic views showing the process for producing an LED of the present invention, employing GaAsP.
Figure 11B:
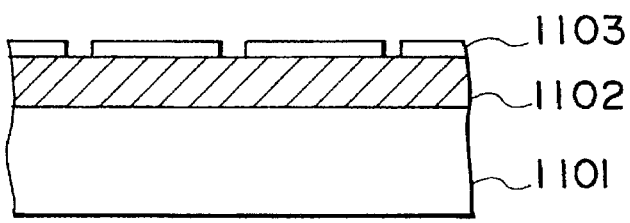
Figure 11C:
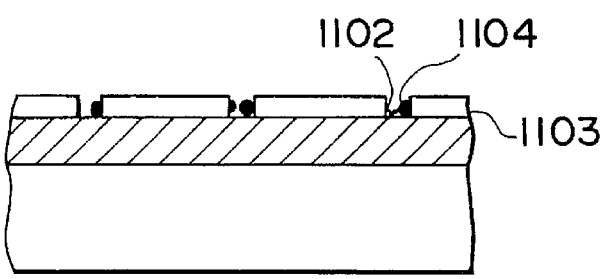
Figure 11D:
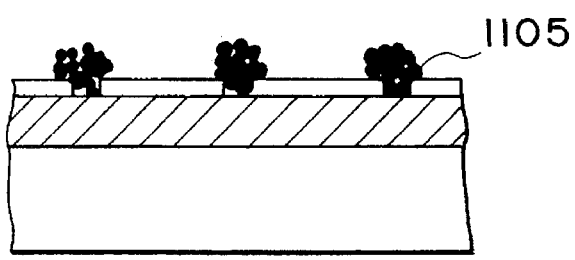
Figure 11E:
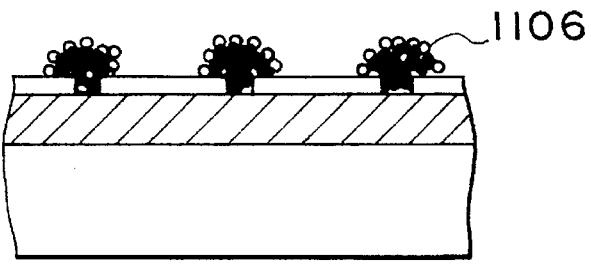
Figure 11F:
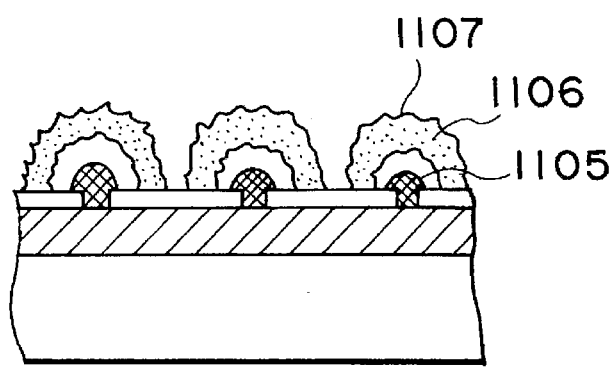
Figure 11G:
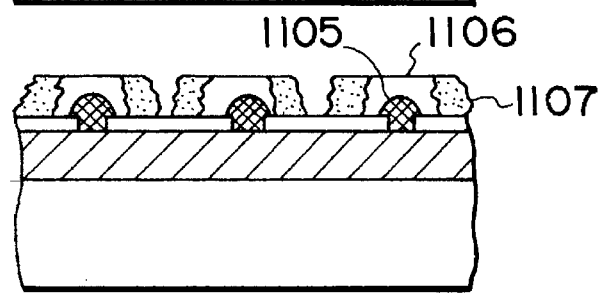
Figure 11H:
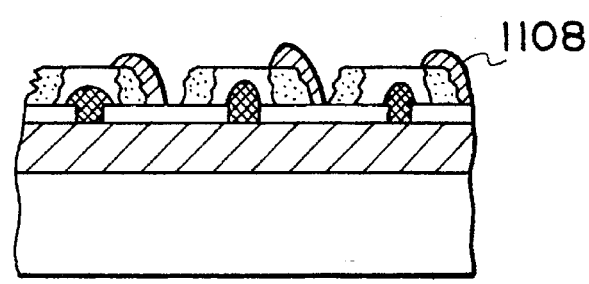
Figure 11I:
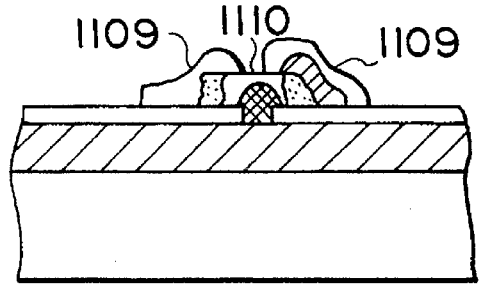
Figure 11J:
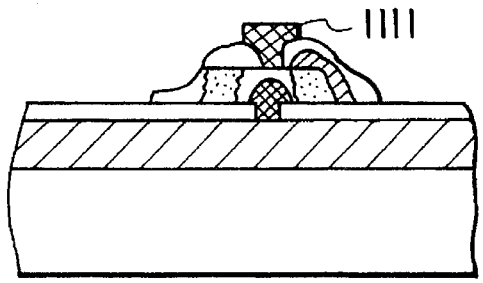
Figure 12A:
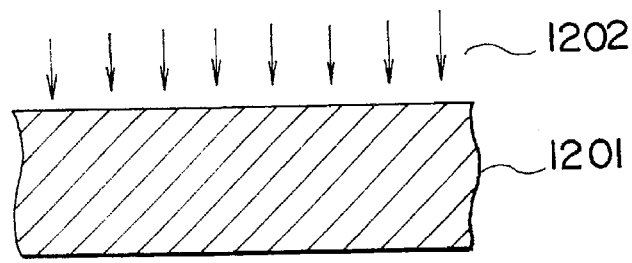
FIGS. 12A to 12G are schematic views showing the process for producing an LED of the present invention, employing GaAlAs.
Figure 12B:
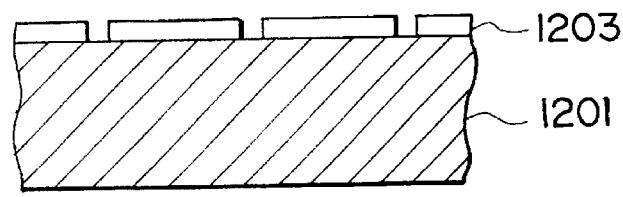
Figure 12C:
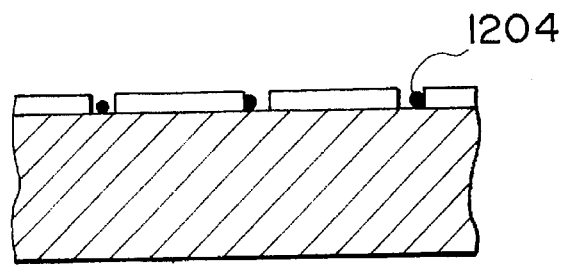
Figure 12D:
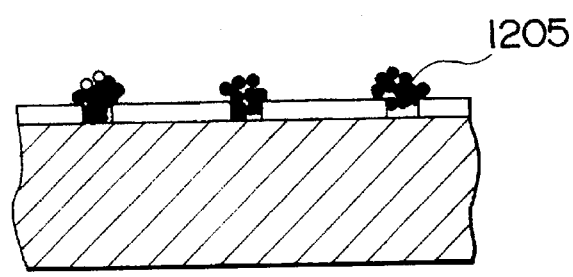
Figure 12E:
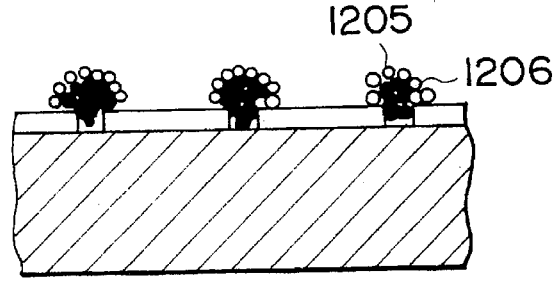
Figure 12F:
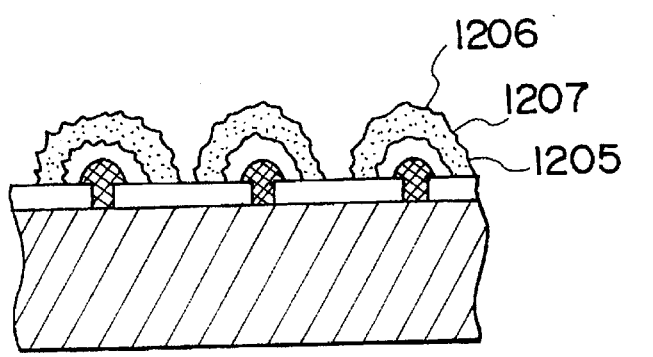
Figure 12G:
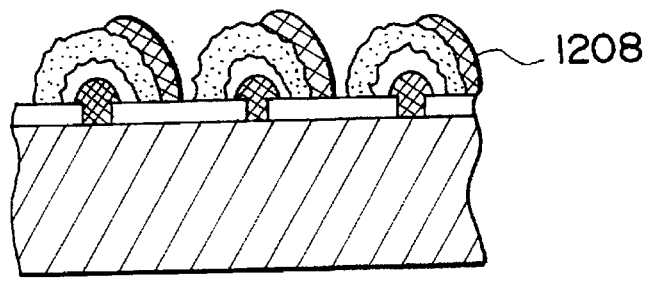

FIG. 9 schematically shows an example of the MOCVD apparatus employed in the present invention. Although there is illustrated a low pressure apparatus of horizontal type, there may be employed a vertical type apparatus supporting the substrate in vertical position, or an apparatus of another type. Referring to FIG. 9, a chamber 909 is made of quartz, provided with a water-cooling jacket, and is evacuated to about $10^{-6}$ Torr by means of a turbo molecular pump 917 except during the crystal growth. A substrate holder 910, made of carbon, can be heated up to 900° C., by means of a high frequency coil (not shown) positioned outside the chamber. The substrate temperature is measured by a thermocouple 912 provided in the holder 910, and can be feedback controlled by the high frequency power.

The raw material gases are introduced from the left-hand end of the chamber. Liquid materials such as trimethyl gallium and trimethyl aluminum, and liquid dopants such as diethylzinc are filled in bubblers 903–905 and are maintained at predetermined temperatures by thermostatic tanks. These materials are introduced into the chamber in the vapor state, by bubbling with hydrogen gas 906 of which flow rates are controlled by mass flow controllers MFC. Gaseous materials such as arsine and phosphine, and gaseous dopants such as silane or selenium hydride are filled in containers 901–902 and directly supplied to the chamber through mass flow controllers MFC. HCl 907, used as the etching gas, is introduced into the chamber through a separate piping system. The gasses introduced into the chamber pass around the substrate 911, and are discharged by a rotary pump 913. In such state the above-mentioned turbo molecular pump is separated from the system by a valve 916. The reaction pressure is controlled by a variable conductance valve 915.

Examples of the material for III–V compound semiconductor include TMG (trimethylgallium), TEG (triethylgallium), TMA (trimethylaluminum), TEA (triethylaluminum) TMIn (trimethylindium), TEIn (triethylindium), TBAS (tert-butylarsine), TMAs (trimethylarsine), TEAs (triethylarsine), DMAs (dimethylarsine), DEAs (diethylarsine), $AsH_3$, TBP (tert-butylphosphine), TMP (trimethylphosphine), TEP (triethylphosphine), $PH_3$ and $NH_3$. Also examples of the dopant include DMSe (dimethylsellenium), DESe (diethylsellenium), DMTe (dimethyltellurium), DETe (diethyltellurium), $SiH_4$, DEZn (diethylzinc), $Cp_2Mg$ (cyclopentamagnesium), and $(MeCp)_2Mg$ (methylcyclopentamagnesium).

Crystal nuclei 105 of the III–V compound are generated on the substrate, by means of the low pressure MOCVD apparatus explained above.

In said generation, the substrate temperature is generally in a range of 570°–850° C., preferably 600°–800° C. and most preferably 660°–780° C., and the reaction pressure is generally 100 Torr or less, preferably 50 Torr or less, and most preferably in a range of 30–40 Torr. The moler ratio of supply of the raw materials of the groups V and III is generally in a range of 10–150, preferably 30–80 and most preferably 40–70.

HCl is introduced as etching gas, with a flow rate in percentage to the total gas flow rate generally in a range of $7\times10^{-3}$–$6\times10^{-4}$ mol. %, preferably $5$–$1\times10^{-3}$ mol. % and most preferably $3$–$2\times10^{-3}$ mol. %.

The method of the present invention, for forming the III–V compound semiconductor device, may also be conducted as will be explained in the following, with reference to FIGS. 14A to 14H.

Figure 14A:
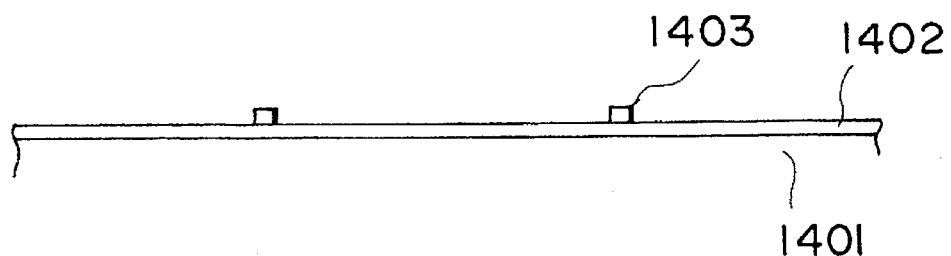
FIGS. 14A to 14H are schematic views showing the process for producing a semiconductor device of the present invention.

At first a non-monocrystalline layer 1402 for example of $SiO_2$ or $SiN_x$ constituting a low nucleation density is formed by thermal oxidation, evaporation or sputtering, on a heat-resistant substrate 1401 composed for example of a monocrystalline semiconductive substrate such as monocrystalline Si substrate or monocrystalline GaAs substrate, a non-monocrystalline substrate such as amorphous quartz glass substrate or ceramic substrate, or a high-melting metal substrate such as W or Ti substrate (FIG. 14A). Otherwise, there may be employed, as shown in FIG. 14G, a heat-resistant non-monocrystalline substrate 1408, such as quartz glass substrate, the surface of which by itself constitutes the non-nucleation surface.

Then, on the non-monocrystalline non-nucleation surface 1402 for example of $SiO_x$ or $SiN_x$, a non-monocrystalline layer of a high nucleation density, such as of $Al_2O_3$ or $Ta_2O_5$, is formed by EB (electron beam) evaporation or resistance-heated evaporation. Then said layer is removed by etching such as RIBE (reactive ion beam etching) or IBE (ion beam etching), leaving areas constituting the nucleation surfaces 1403, which are generally square with a size not exceeding 10 µm, preferably not exceeding 6 µm and most preferably not exceeding 3 µm. Otherwise the nucleation surfaces may be formed by implanting ions such as Al or As ions into small areas by focused ion beam. It is also possible to form a mask leaving small areas, then implanting Al or As ions through said mask into the substrate surface, and then removing said mask, thereby increasing the nucleation density in said small areas.

Figure 14B:
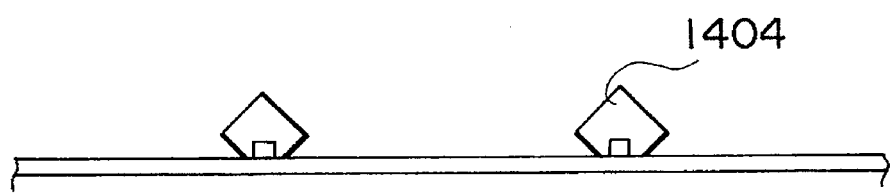
Figure 14C:
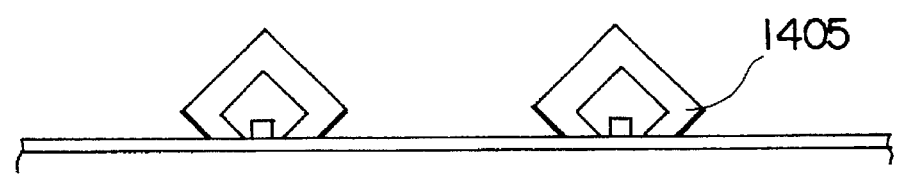
Figure 14D:
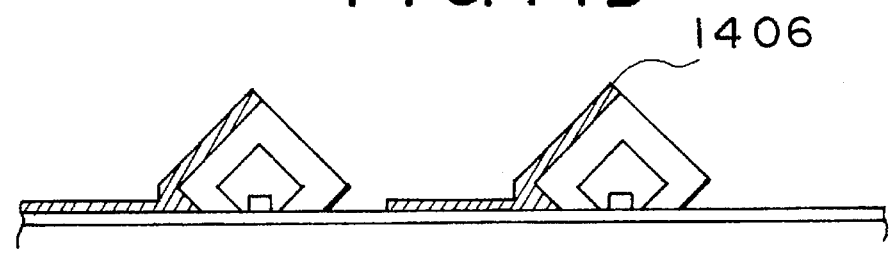
Figure 14E:
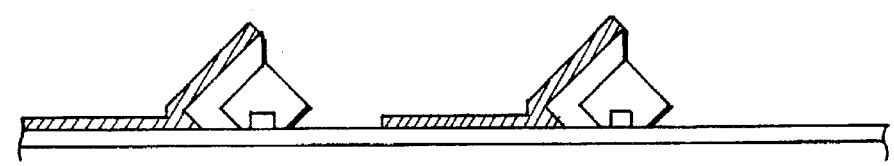
Figure 14F:
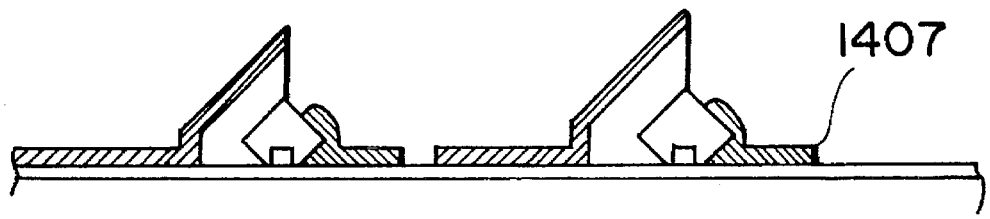
Figure 14G:
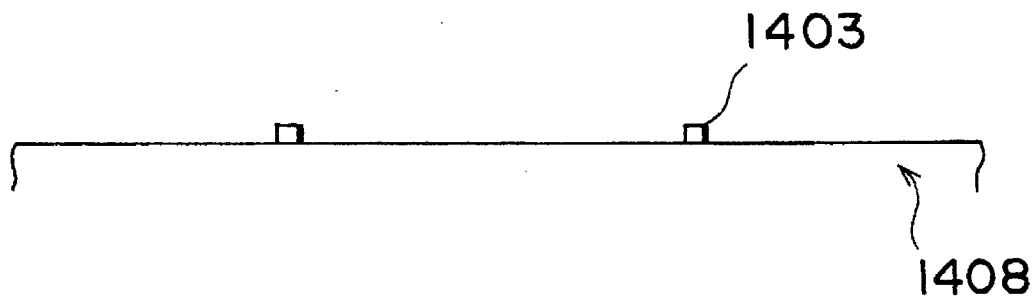
Figure 14H:
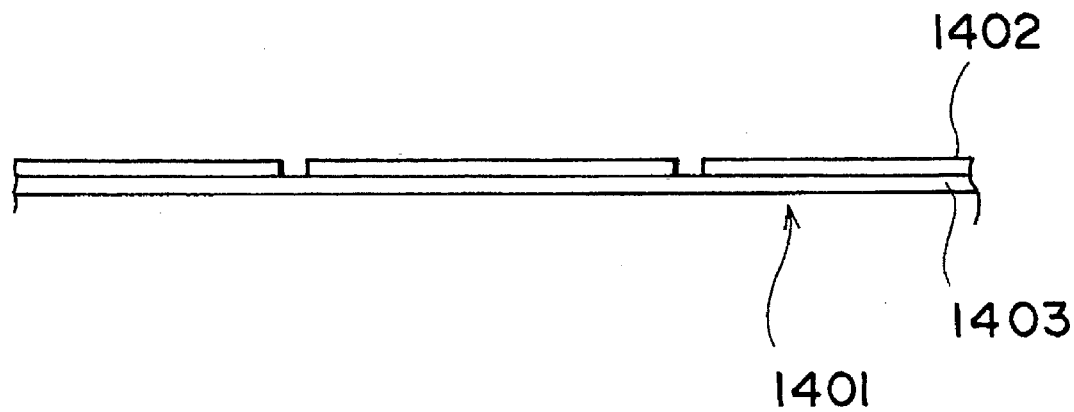

The non-nucleation surface and the nucleation surfaces may also be formed as shown in FIG. 14H, by depositing a non-monocrystalline layer 1403 of a high nucleation density, for example of $Al_2O_3$ or $Ta_2O_5$ on a heat-resistant substrate, then depositing a non-monocrystalline layer 1402 of a material such as $SiO_2$ or $SiN_x$ of a nucleation density smaller than that of said non-monocrystalline layer 1403, and selectively removing said layer 1402, constituting the non-nucleation surface, in small areas thereby exposing the nucleation surface in said small areas.

The non-monocrystalline layer may be deposited, for example, by EB evaporation, resistance-heated evaporation or sputtering.

Then, on the substrate having the non-nucleation and nucleation surface, semiconductor crystals are grown by the MOCVD (metalorganic chemical vapor deposition) (FIG. 14B).

The MOCVD can be conducted as explained before, thereby forming n- or p-semiconductor 1404. The conditions of growth depend on and vary according to the apparatus employed. The growth time is determined by the size of the semiconductor device.

Subsequently the doping material is changed, thereby forming a semiconductor 1405 of n- or p-type, opposite to the conductive type of the first semiconductor formed in FIG. 14B. The conditions of growth are similar to those explained above (FIG. 14C).

Subsequently an electrode 1406 is formed on a part of the crystal formed by MOCVD (FIG. 14D).

The electrode may be formed, for example, by resistance-heated evaporation or electron beam-heated evaporation. The patterning of the electrode can be achieved, for example, by a lift-off process of patterning a photoresist layer at first, then forming the electrode and removing the photoresist layer subsequently, or a process of forming the electrode layer over the entire surface and removing said layer in the unnecessary parts.

Then, the grown polycrystalline layer is removed in a part of the area other than the electrode areas, thereby exposing the semiconductor of the first conductive type. Said partial removal of the polycrystalline nuclei is conducted by dry etching such as RIBE or IBE, or by wet etching (FIG. 14E).

Finally a semiconductor device is obtained by forming an electrode 1407 on thus exposed semiconductor (FIG. 14F). The formation of said electrode may be conducted as explained before.

In the following the present invention will be clarified in more details by examples thereof.

[EXAMPLE 1]

FIGS. 10A to 10J are schematic views showing the process of producing an LED of the present invention, employing $Ga_{0.8}Al_{0.2}As$ polycrystals.

(A) On a Mo substrate of a thickness of 0.5 mm, a $SiO_2$ film 1002 of a thickness of 1000 Å, constituting the non-nucleation surface, was deposited by CVD employing $SiH_4$ and $O_2$. The deposition was conducted under the conditions of $SiH_4$ 45 sccm, $O_2$ 60 sccm, $N_2$ 50 sccm, a substrate temperature of 440° C., an atmospheric reaction pressure and a deposition time of 1 minute.

(B) Then a polysilicon film of a thickness of 300 Å was deposited by LPCVD, and photolithographically etched, with etchant of $HF:HNO_3:CH_3COOH=1:60:60$, into small squares with a side of 2 μm, constituting nucleation surfaces 1004. The distance between the adjacent nucleation surfaces was 40 μm. The polysilicon film deposition was conducted under conditions of $SiH_4$ 45 sccm, a substrate temperature of 620° C., and a pressure of 200 mTorr.

(C) GaAlAs growth was conducted in the above-explained MOCVD apparatus, shown in FIG. 9.

(D) At first n-GaAs 1005 was generated on the nucleation surfaces 1004, under the following conditions:

| | |
|---|---|
| TMG | $2.4 \times 10^{-5}$ mol/min. |
| $AsH_3$ | $1.8 \times 10^{-3}$ mol/min. |
| $SiH_4$ (dopant) | $9.0 \times 10^{-6}$ mol/min. |
| HCl (etching gas) | $1 \times 10^{-3}$ mol/min. |
| $H_2$ (carrier gas) | 10 l/min. |
| Substrate teperature | 775 °C. |
| Pressure | 20 Torr |

GaAs was employed because it enables easier selective growth and provides larger crystal grain size at the nucleation, in comparison with GaAlAs.

(D) Growth was continued for 10 minutes, until the GaAs crystal islands grew to a diameter of 3 μm.

(E) Then TAM was introduced into the raw material gas to grow n-GaAlAs 1006 on the GaAs 1005, under the following film forming conditions:

| | |
|---|---|
| TMG | $2.0 \times 10^{-5}$ mol/min. |
| TMA | $4.0 \times 10^{-6}$ mol/min. |
| $AsH_3$ | $1.8 \times 10^{-3}$ mol/min. |
| $SiH_4$ (dopant) | $9.0 \times 10^{-6}$ mol/min. |
| HCl (etching gas) | $1 \times 10^{-3}$ mol/min. |
| $H_2$ (carrier gas) | 10 l/min. |
| Substrate temperature | 775 °C. |
| Pressure | 20 Torr |

The growth time was 40 minutes, and the GaAlAs crystal islands grew to a size of 20 μm.

(F) The dopant was switched from $SiH_4$ to DEZ to develop p-GaAlAs 1007. The film forming conditions were same as those in (E), except $SiH_4$ was replaced by DEZ with a flow rate of $1\times10^{-5}$ mol/min. The growth was conducted for 15 minutes, whereupon the crystal islands grew to a size of 23 μm.

(G) Mechanochemical lapping was conducted with bromomethanol to grind off the surface of the crystal islands by about 7 μm, thereby exposing the internal n-GaAlAs 1006.

(H) P-electrodes 1008 were formed by a lift-off process, consisting of forming photoresist patterns and depositing a Cr film of 500 Å and an Au film of 5000 Å in continuation by resistance-heated evaporation.

(I) A $SiN_x$ insulating film 1009 of a thickness of 4000 Å was deposited by plasma CVD employing $SiH_4$ and $NH_3$, under the conditions of $SiH_4$ 100 sccm, $NH_3$ 200 sccm, a substrate temperature of 350° C., a pressure of 0.2 Torr and a deposition time of 1 hour. Then contact holes 1010 were formed by photoresist patterning followed by RIE (reactive ion etching) with $CCl_2F_2$, under the following etching conditions of $CCl_2F_2$ 20 sccm, a pressure of $4\times10^{-2}$ Torr, an RF power of 100 W, a substrate temperature at the room temperature, and an etching time of 2 minutes.

(J) n-electrodes 1011 were formed by a lift-off process, conducted by photoresist pattern formation followed by AuGe/Au evaporation with resistance heating, with thicknesses respectively of 1000 and 5000 Å.

The device structure, after completion, was annealed for 20 minutes at 450° C. in Ar atmosphere.

The completed device was powered and subjected to the measurement with a spectrometer and a light power meter. The measurements on 10 devices showed a peak wavelength at 770 nm in the light emission spectrum. When a drive current of 50 mA was applied in pulse form (1 kHz, duration 500 nsec), the light emission intensity was in a range of 0.06–0.1 mW.

[EXAMPLE 2]

FIGS. 11A to 11J are schematic views showing the method of forming an LED device of the present invention, employing GaAsP polycrystals.

(A) On an alumina substrate 1101 of a thickness of 0.5 mm, an AlN film 1102 of a thickness of 1500 Å, constituting the non-nucleation surface, was deposited by RF sputtering. The deposition was conducted under the conditions of a substrate temperature at the room temperature, a target composed of Al, Ar and $N_2$ gasses with a flow rate ratio of 2/3, a pressure of $5\times10^{-2}$ Torr, an RF power of 600 W, and a deposition rate of 60 Å/min.

(B) Then an amorphous $SiN_x$ film 1103 of a thickness of 300 Å was deposited by plasma CVD, under the conditions of a substrate temperature of 350° C., a reaction pressure of 0.2 Torr, with $SiH_4$ of 100 cc and $NH_3$ of 200 cc. The $SiN_x$ film 1103 was partially removed by photolithographic patterning and reactive ion etching (RIE) to form small square windows of 2 μm with a pitch of 60 μm, thereby exposing AlN, constituting the nucleation surfaces for GaAs.

Said reactive ion etching was conducted with $CF_4$ and $O_2$ gasses with a flow rate ratio of $CF_4/O_2=5/1$, under the conditions of a pressure of $7\times10^{-2}$ Torr, an RF power of 100 W and an etching rate of 100 Å/min.

(C) Then the MOCVD was conducted to at first generate n-GaAs crystal nuclei 1104 on the nucleation surfaces 1102, under the following film forming conditions:

| | |
|---|---|
| TMG | $2.4 \times 10^{-5}$ mol/min. |
| $AsH_3$ | $1.8 \times 10^{-3}$ mol/min. |
| $SiH_4$ (dopant) | $9.0 \times 10^{-6}$ mol/min. |
| HCl (etching gas) | $1 \times 10^{-3}$ mol/min. |
| $H_2$ (carrier gas) | 10 l/min. |
| Substrate temperature | 775 °C. |
| Pressure | 20 Torr |

(D) Growth was continued for 10 minutes, until the GaAs crystal islands grew to a diameter of 3 μm.

(E) Then TBP was introduced into the raw material gas to grow n-GaAsP 1106 on the GaAs 1105, under the following film forming conditions:

| | |
|---|---|
| TMG | $2 \times 10^{-5}$ mol/min. |
| TBP | $7 \times 10^{-4}$ mol/min. |
| AsH$_3$ | $1.2 \times 10^{-3}$ mol/min. |
| SiH$_4$ (dopant) | $5 \times 10^{-3}$ mol/min. |
| HCl (etching gas) | $1 \times 10^{-3}$ mol/min. |
| H$_2$ (carrier gas) | 10 l/min. |
| Substrate temperature | 760 °C. |
| Pressure | 28 Torr |

The growth time was 45 minutes, and the GaAsP crystal islands grew to a size of 22 μm.

(F) The dopant was switched from SiH$_4$ to DEZ to develop p-GaAsP 1107. The growing conditions were the same as those in (E), except that SiH$_4$ was replaced by DEZ with a flow rate of $3 \times 10^{-6}$ mol/min. The growth was conducted for 15 minutes, whereupon the crystal islands grew to a size of 25 μm.

(G) Surface lapping was conducted with diamond paste with a particle size of 0.3–0.8 μm to grind off the surface of the crystal islands by about 6–7 μm, thereby exposing the internal n-GaAsP 1106.

(H) P-electordes 1108 were formed by a lift-off process, consisting of forming photoresist patterns and depositing a Zn film of 500 Å and an Au film of 8000 Å in continuation by heated evaporation.

(I) A SiO$_2$ film 1109 of a thickness of 5000 Å was deposited by magnetron sputtering, under the depositing conditions of a substrate temperature of 250° C., a target composed of SiO$_2$, introduced gas of Ar, a pressure of $6 \times 10^{-3}$ Torr, an RF power of 1 kW and a deposition rate of 300 Å/min. Then contact holes 1110 reaching the n-GaAsP 1106 were formed by photoresist patterning followed by etching with an etchant of HF:H$_2$O=1:40.

(J) After photoresist pattern formation, Au and Sn were co-evaporated from separate sources to a thickness of 1000 Å, and then Au alone was evaporated in continuation for obtaining a thickness of 6000 Å. Then n-electrodes 1111 were formed by the lift-off process.

At the end of the above-explained process, the obtained device was annealed for 20 minutes at 450° C. in Ar atmosphere.

The completed device was powered and subjected to the measurement with a spectrophotometer and a light power meter. The measurements on 10 devices showed a peak wavelength at 660 nm in the light emission spectrum. When a drive current of 50 mA was applied in pulse form (1 kHz, duration 500 nsec), the light emission intensity was 0.01–0.02 mW.

[EXAMPLE 3]

FIGS. 12A to 12G are schematic views showing the method of producing an LED device of the present invention, employing GaAlAs.

(A) On a molybdenum substrate 1201 of a thickness of 0.2 mm, Au ions 1202 were implanted by an ion implater with a concentration of $1 \times 10^{14}$ cm$^{-3}$, thereby forming a nucleation surface.

(B) Then a SiO$_2$ film 1203 of a thickness of 1000 Å was deposited, as a non-nucleation surface, by CVD employing SiH$_4$ and O$_2$, under the condition of SiH$_4$ 45 sccm, O$_2$ 60 sccm, N$_2$ 50 sccm, a substrate temperature of 440° C., a reaction pressure at atmospheric pressure, and a deposition time of 1 minute.

Said SiO$_2$ film 1203 was photolithographically removed by RED in small squares of a size of 3 μm to expose molybdenum, thus constituting the nucleating surfaces.

(C) At first n-GaAs crystal nuclei 1204 were generated on the nucleation surfaces 1201, under the following film forming conditions:

| | |
|---|---|
| TMG | $2.4 \times 10^{-5}$ mol/min. |
| AsH$_3$ | $1.8 \times 10^{-3}$ mol/min. |
| SiH$_4$ (dopant) | $9.0 \times 10^{-6}$ mol/min. |
| HCl (etching gas) | $1 \times 10^{-3}$ mol/min. |
| H$_2$ (carrier gas) | 10 l/min. |
| Substrate temperature | 775 °C. |
| Pressure | 20 Torr |

(D) Growth was continued for 10 minutes, until the n-GaS crystal islands 1205 grew to a size of 3 μm.

(E) Then TAM was introduced into the raw material gas to grow n-GaAsAs 1206 on the GaAs 1205, under the following film forming conditions:

| | |
|---|---|
| TMG | $2.0 \times 10^{-5}$ mol/min. |
| TMA | $4.0 \times 10^{-6}$ mol/min. |
| AsH$_3$ | $1.8 \times 10^{-3}$ mol/min. |
| SiH$_4$ (dopant) | $9.0 \times 10^{-6}$ mol/min. |
| HCl (etching gas) | $1 \times 10^{-3}$ mol/min. |
| H$_2$ (carrier gas) | 10 l/min. |
| Substrate temperature | 775 °C. |
| Pressure | 20 Torr |

The growth time was 35 minutes, and the GaAlAs crystal islands grew to a size of 18 μm.

(F) The dopant was switched from SiH$_4$ to DEZ to develop p-GaAlAs 1207. The growing conditions were same as those in (E), except that SiH$_4$ was replaced by DEZ with a flow rate of $1 \times 10^{-5}$ mol/min. The growth was conducted for 10 minutes, whereupon the crystal islands grew to a size of 20 μm.

(G) After photoresist pattern formation, a Cr film of 500 Å and an Au film of 5000 Å were deposited in continuation by resistance-heated evaporation, and p-electrodes 1208 were formed by lift-off process. Thereafter annealing was conducted for 20 minutes at 450° C. in Ar atmosphere.

The completed device was powered and subjected to the measurement with a spectrophotometer and a light power meter. The measurements on 10 devices showed a peak wavelength at 770 nm in the light emission spectrum. When a drive current of 50 mA was applied in pulse form (1 kHz, duration 500 nsec), the light emission intensity was 0.03–0.06 mW.

[EXAMPLE 4]

In the following explained is a method for producing an LED, utilizing stripe-shaped nucleation surfaces. FIGS. 13A to 13E are schematic views showing the method of producing an infrared LED of the present invention, utilizing GaAs' polycrystals.

(A) On an alumina substrate 1302 of a thickness of 1 mm, a SiO$_2$ film 1302 of a thickness of 1000 Å was deposited by a method similar to that explained before.

(B) Then a polysilicon film was deposited with a thickness of 300 Å, and was photolithographically patterned into small rectangles of 2×10 μm, constituting nucleation surfaces 1303.

(C) On this substrate, n-GaAs 1304 was deposited with a thickness of 15 μm by MOCVD, under the same conditions as in the example 1.

(D) Then p-GaAs 1305 was deposited with a thickness of 3 μm, by replacing SiH$_4$ with DEZ with a flow rate of $2 \times 10^{-5}$ mol/min.

(E) After photoresist pattern formation, a Cr film of 500 Å and an Au film of 5000 Å were deposited, and p-electrodes 1306 were formed by lift-off process.

(F) Surface lapping was conducted in a similar manner as in the example 2, thereby grinding off the surface of the crystal by about 6 μm and exposing the internal n-GaAs 1304.

(G) A $SiO_2$ film 1308 of a thickness of 5000 Å was deposited by magnetron sputtering, and contact holes 1309 were formed by etching in the same manner as in the examples 1 and 2.

(H) After photoresist pattern formation, an AuGe alloy film of 500 Å and an Au film of 2000 Å were deposited, and n-electrodes 1307 were formed by lift-off process. Finally annealing was conducted for 20 minutes at 450° C. in Ar atmosphere. The completed device was powered and was subjected to measurement with a spectrophotometer and a light power meter. Measurements on 10 devices showed a peak wavelength at 880 nm in the light emission spectrum. When a drive current of 50 mA was applied in pulse form (1 kHz, duration 500 nsec), the light emission intensity was 0.08–0.2 mW.

[EXAMPLE 5]

In the following description, reference is to be made to FIGS. 14A to 14H.

On a Si substrate 1401, a $SiO_2$ layer 1402 and an $Al_2O_3$ layer 1403 were formed by EB evaporation, which was conducted, in vacuum of $1\times10^{-6}$ Torr, by supply of oxygen at a rate of 10 cc/min. Then, the $Al_2O_3$ layer 1403 was removed by wet etching with an etchant liquid ($H_2SO_4$:$H_2O_2$:$H_2O$=1:1:2), photolithographically leaving small squares of a size of 0.8 μm with a pitch of 50 μm (FIG. 14A).

Then monocrystalline n-GaAs 1404 (impurity concentration: $1\times10^{18}$ cm$^{-3}$) was grown by MOCVD method, employing TMG ($2.4\times10^{-5}$ mol/min.) and $AsH_3$ ($1.8\times10^{-5}$ mol/min.), with $SiH_4$ ($8.9\times10^{-6}$ mol/min.) as dopant and $H_2$ at 10 l/min. as the carrier gas. The substrate temperature was 670° C. and the pressure was 20 Torr. The growth time was 30 minutes.

Then the dopant was changed to grow monocrystalline p-GaAs 1405 (impurity concentration: $1\times10^{18}$ cm$^{-3}$) (FIG. 14B).

The growth was conducted by employing TMG ($2.4\times10^{-5}$ mol/min.) and $AsH_3$ ($1.8\times10^{-4}$ mol/min.), with DEZn ($1\times10^{-5}$ mol/min.) as the dopant and $H_2$ (10 l/min.) as the carrier gas, and with a temperature of 670° C., a pressure of 20 Torr and a growth time of 15 minutes.

Then a photoresist layer of a thickness of 5 μm was formed, except the areas where electrodes are to be formed. Then a Cr (500 Å)/Au (5000 Å) film 1406 was formed by resistance-heated evaporation, and ultrasonic washing was conducted for 20 minutes in photoresist stripper solution (FIG. 14D).

Then RIE (reactive ion etching) was conducted with introduction of $CCl_2F_2$ gas at a rate of 20 cc/min., and with a pressure of 4 Pa, a power of 100 W and an etching time of 3 minutes, until monocrystalline n-GaAs was exposed, utilizing the electrodes as the mask (FIG. 14E).

In a part of the exposed area of the monocrystalline n-GaAs of the first conductive type, an electrode was formed (FIG. 14F) by forming an AuGe (2000 Å)/Au (5000 Å) film 1407 in a similar manner to FIG. 14D. A GaAs diode was prepared in this manner. A comparative example involving a planarization step showed peeling of monocrystalline GaAs in about 8% of the devices at the grinding operation, but, in the method of the present invention, GaAs peeling in the process after the crystal formation was reduced to about 2%.

[EXAMPLE 6]

In the following description, reference is to be made to FIGS. 15A to 15H.

Figure 15A:
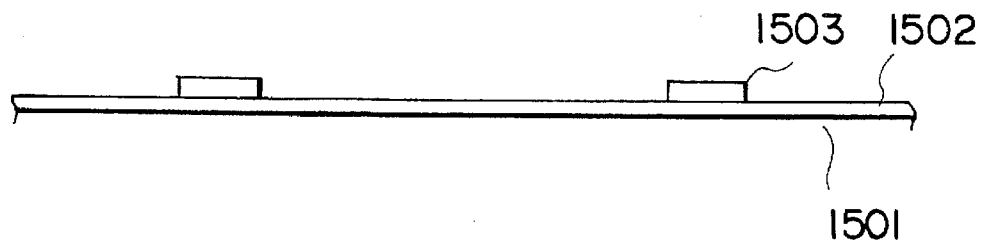
FIGS. 15A to 15H are schematic views showing the process for producing a semiconductor device of the present invention and also showing an LED array head.

On a Si substrate 1501, a $SiO_2$ layer 1502 and an $Al_2O_3$ layer 1503 were formed by EB evaporation. The evaporation was conducted under vacuum of $1\times10^{-6}$ Torr, with supply of oxygen at a rate of 10 cc/min. Then the $Al_2O_3$ layer 1503 was remvoed by wet etching with etching liquid ($H_2SO_4$:$H_2O_2$:$H_2O$=1:1:2), photolithographically leaving small squares of a size of 5 μm spaced by a pitch of 50 μm (FIG. 15A).

Figure 15B:

Then polycrystalline n-GaAs 1504 (impurity concentration: $1\times10^{18}$ cm$^{-3}$) was grown by MOCVD (FIG. 15B). The growth was conducted employing TMG ($2.4\times10^{-5}$ mol/min.) and $AsH_3$ ($1.8\times10^{-5}$ mol/min.) with $SiH_4$ ($8.9\times10^{-6}$ mol/min.) as the dopant and $H_2$ (10 l/min.) as the carrier gas, with a substrate temperature of 670° C., a pressure of 20 Torr and a growth time of 30 minutes.

Figure 15C:
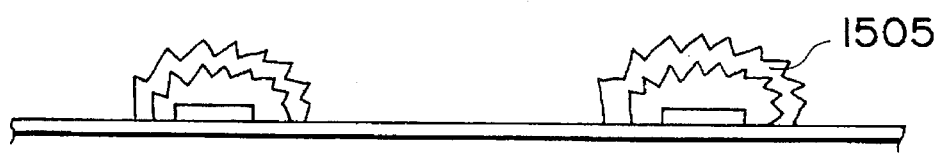

Then the dopant was switched to grow polycrystalline p-GaAs 1505 (impurity concentration: $1\times10^{18}$ cm$^{-3}$) (FIG. 15C). The growth was conducted employing TMG ($2.4\times10^{-5}$ mol/min.) and $AsH_3$ ($1.8\times10^{-4}$ mol/min.), with DEZn ($1\times10^{-5}$ mol/min.) as the dopant and $H_2$ (10 l/min.) as the carrier gas, with a growth temperature of 670° C., a pressure of 20 Torr and a growth time of 15 minutes.

Figure 15D:
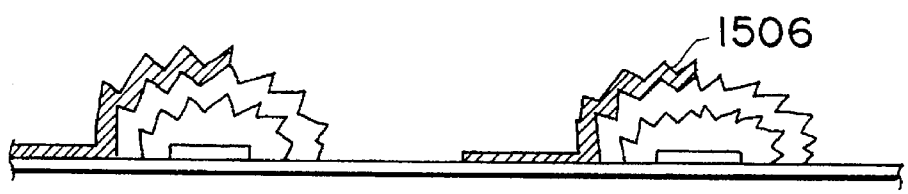

Subsequently a photoresist layer of a thickness of 5 μm was formed, excluding areas where electrode are to be formed, and a Cr (500 Å)/Au (5000 Å) film 1506 was formed by resistance-heated evaporation. Then ultrasonic washing was conducted for 20 minutes in photoresist stripper (FIG. 15D).

Figure 15E:
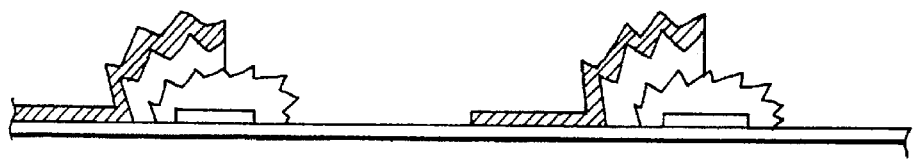

RIE (reactive ion etching) was conducted by the introduction of $CCl_2F_2$ at a flow rate of 20 cc/min. with a pressure of 4 Pa, a power of 100 W and an etching time of 3 minutes, utilizing the electrodes as the mask, until polycrystalline n-GaAs became exposed (FIG. 15E).

Figure 15F:
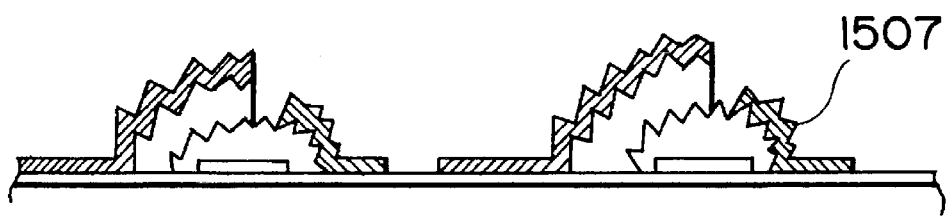

In a part of the exposed area of polycrystalline n-GaAs, an electorde was formed by depositing an AuGe (2000 Å)/Au (5000 Å) film 1507 by a method similar to that in the example 1 (FIG. 15F). A GaAs LED was completed in this manner. In a comparative example involving a planarization step, peeling of polycrystalline GaAs appeared in about 5% of the device at the prinding step, but the method of the present invention reduced the peeling of GaAs to about 2% in the process after the crystal formation.

Figure 15G:
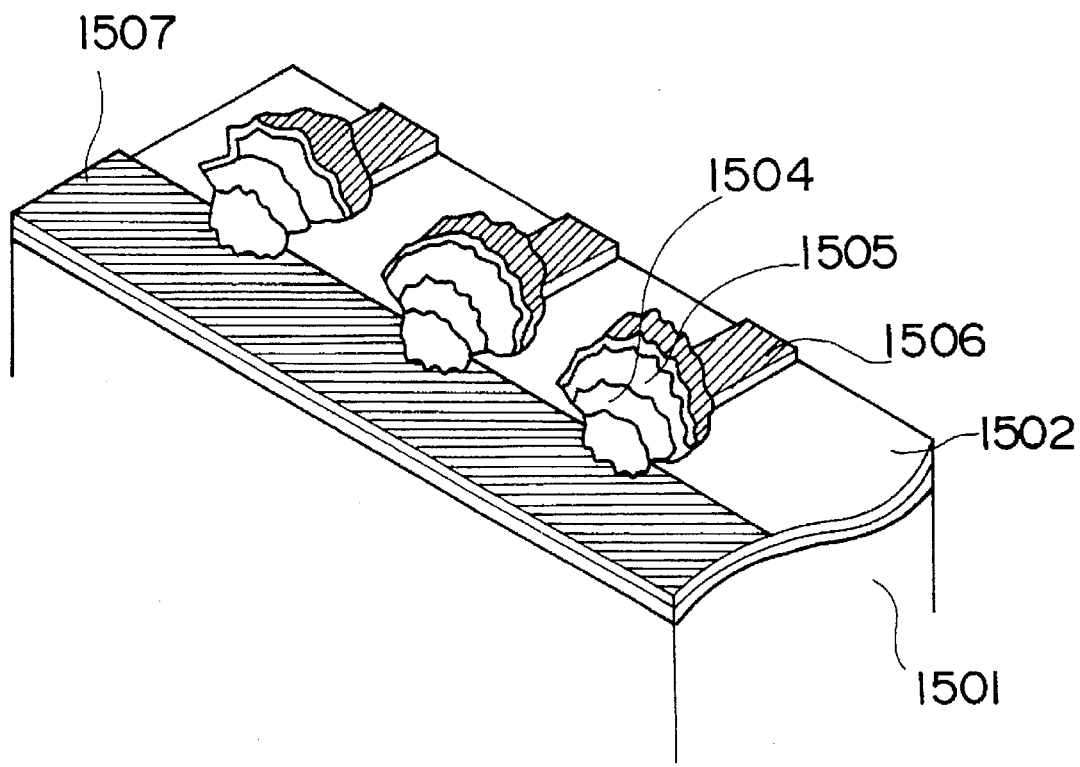
Figure 15H:
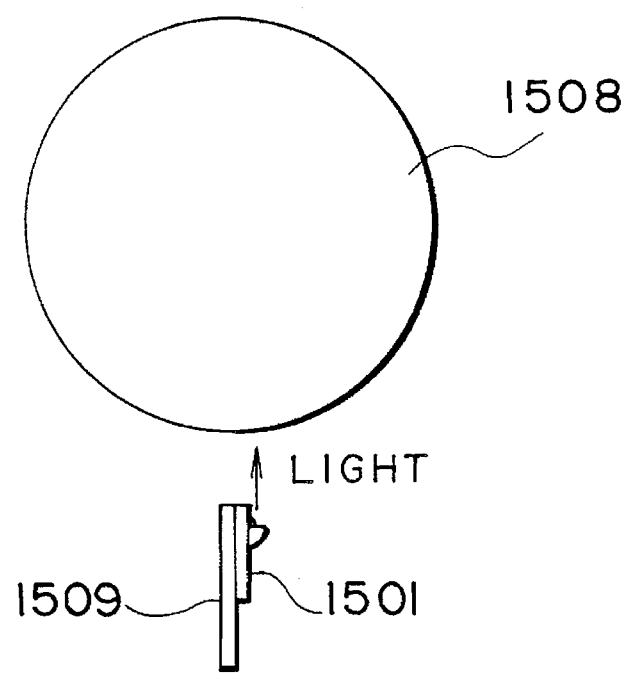

Said GaAs LED's were formed as a one-dimensional array as shown in FIG. 15G and employed as an LED head for an electrophotographic printer as shown in FIG. 15H. In this manner the LED array could be mounted, without a large space, in the vicinity of a photosensitive drum 1508, and could also be adhered onto a supporting substrate 1509 with only one optical axis alignment.

[EXAMPLE 7]

In the following description, reference is to be made to FIGS. 16A to 16H.

Figure 16A:
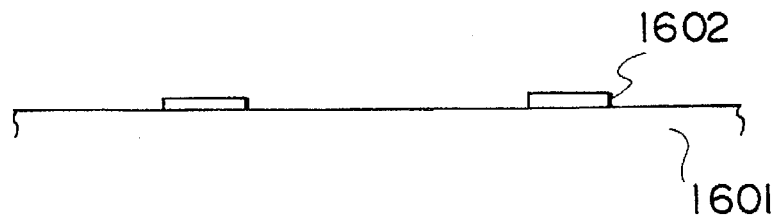
FIGS. 16A to 16H are schematic views showing the process for producing an electronic device of the present invention.

On a $SiO_2$ substrate 1601, a poly Si film 1602 of a thickness of 500 Å was deposited by CVD. Then said poly Si film was removed by dry etching, photolithographically leaving small square area 1602 of a size of 5 μm, spaced by a pitch of 50 μm (FIG. 16A). Said dry etching was conducted by the introduction of $CF_4$ (20 cc/min.) and $O_2$ (2 cc/min.), with a pressure of 10 Pa and a power of 100 W.

Figure 16B:

Then polycrystalline n-GaAs 1603 (impurity concentration: $1\times10^{18}$ cm$^{-3}$) was grown by MOCVD (FIG. 16B). The growth was conducted employing TMG ($2.4\times10^{-5}$ mol/min.) and $AsH_3$ ($1.8\times10^{-5}$ mol/min.), with $SiH_4$ ($8.9\times10^{-6}$ mol/min.) as the dopant and $H_2$ (10 l/min.) as the carrier gas, and with a substrate temperature of 670° C., a pressure of 20 Torr and a growth time of 30 minutes.

Figure 16C:
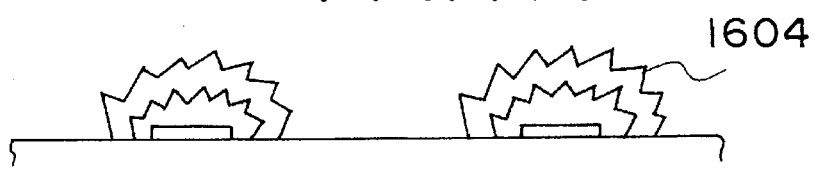

Then the dopant was switched to grow polycrystalline p-GaAs 1604 (impurity concentration: $1\times10^{18}$ cm$^{-3}$) (FIG. 16C). The growth was conducted by employing TMG ($2.4\times10^{-5}$ mol/min.) and $AsH_3$ ($1.8\times10^{-4}$ mol/min.), with DEZn ($1\times10^{-5}$ mol/min.) as the dopant and $H_2$ (10 l/min.) as the carrier gas, and with a temperature of 670° C., a pressure of 20 Torr and a growth time of 15 minutes.

Figure 16D:
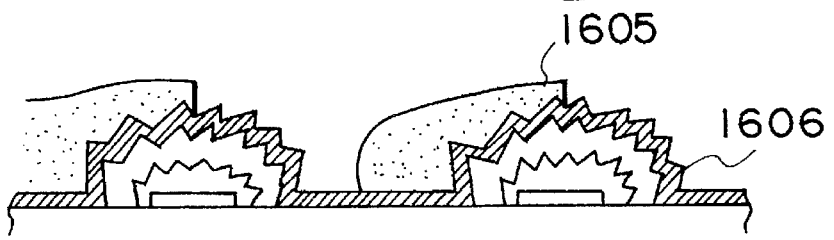

Then a Cr (500 Å)/Au (5000 Å) film 1606 was formed on the entire area of the substrate by resistance-heated evaporation, and a photoresist layer 1605 was formed only in areas where electrodes are to be formed (FIG. 16D).

Figure 16E:
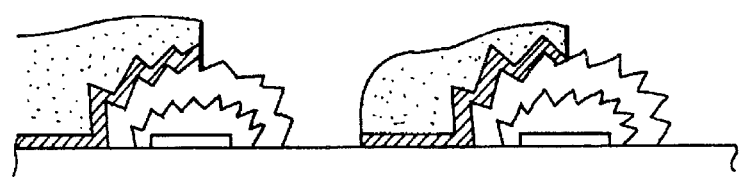

Subsequently etching was conducted, utilizing said photoresist as the mask, to remove said film 1606, thereby forming electrodes (FIG. 16E). In said etching, Au was removed by iodine-potassium iodine, and then Cr was removed by a solution of phosphoric acid:hydrochloric acid:water=1:1:1.

Figure 16F:
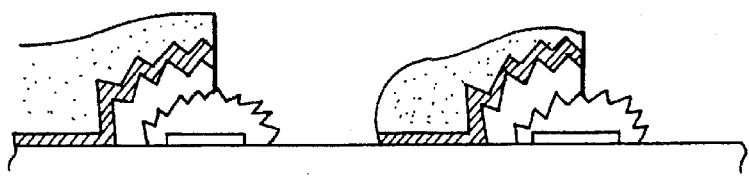

Then the polycrystalline n-GaAs was exposed by removal of polycrystalline p-GaAs with a solution of $NH_3OH:H_2O_2$=1:50 (FIG. 16F).

Figure 16G:
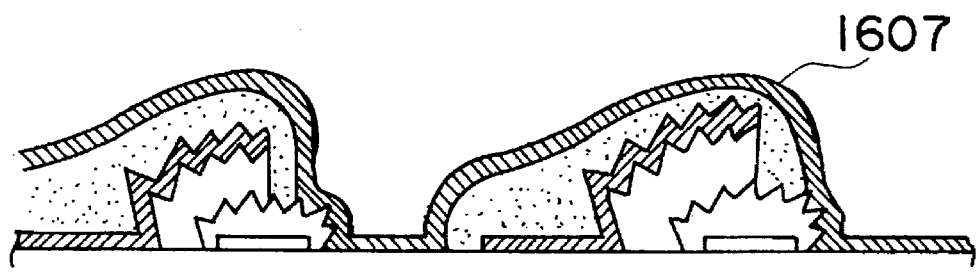

The photoresist layer was removed, and a photoresist layer was formed anew excluding areas where the other electrodes are to be formed (FIG. 16G). Then an AuGe (2000 Å)/Au (5000 Å) film 1607 was formed by resistance-heated evaporation.

Figure 16H:
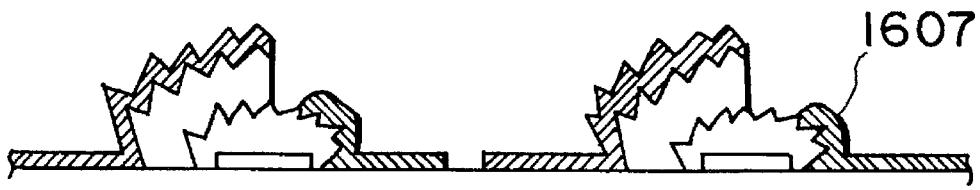

Then the electrodes were formed by the lift-off process, conducted by the removal of hte photoresist layer (FIG. 16H). A GaAs diode was formed in this manner. In a comparative example involving a planarization step, the peeling of polycrystalline GaAs appeared in about 5% of the devices at the grinding step, but the method of the present invention could reduce the peeling of GaAs in the process after crystal formation, to about 3%.

[EXAMPLE 8]

LED device were prepared employing polycrystalline GaAs, of which grain size was controlled by the size of the nucleation surfaces, under the following conditions and subjected to the measurements of light-emitting characteristics:

| | |
|---|---|
| Trimethylgallium (TMG) | $3.0\times10^{-5}$ mol/min. |
| Arsine ($AsH_3$) | $2.0\times10^{-3}$ mol/min. |
| Reaction pressure | 20 Torr |
| Substrate temperature | 775 °C. |
| Growth time | 60 minutes |
| Diluting gas ($H_2$) flow rate | 0.45 mol/min. |
| Etching gas (HCl) flow rate | $2.2\times10^{-5}$ mol/min. |
| Doping gases | |
| P (DEZ) | $6\times10^{-5}$ mol/min. |
| N ($SiH_4$) | $5\times10^{-7}$ mol/min. |
| Nucleation surface | polysilicon |
| Non-nucleation surface | $SiO_2$ |

The light emitted from thus prepared LED was subjected to the measurement of intensity by a photomultiplier, and the light intensity was correlated with the crystal grain size. Regardless of the grain size, all the LED devices showed a peak wavelength at 880 nm. FIG. 5 shows the relationship between the average grain size of the crystal island and the light emission intensity.

The light emission intensity of LED is lowered with the decrease in the crystal grain size, particularly in case of a grain size less than 0.5 μm. This is presumably due to a fact that a decrease in the crystal grain size increases the number of grain boundaries which are the cause of recombination, thereby resulting in a loss in the light emission efficiency.

[EXAMPLE 9]

Figure 17:
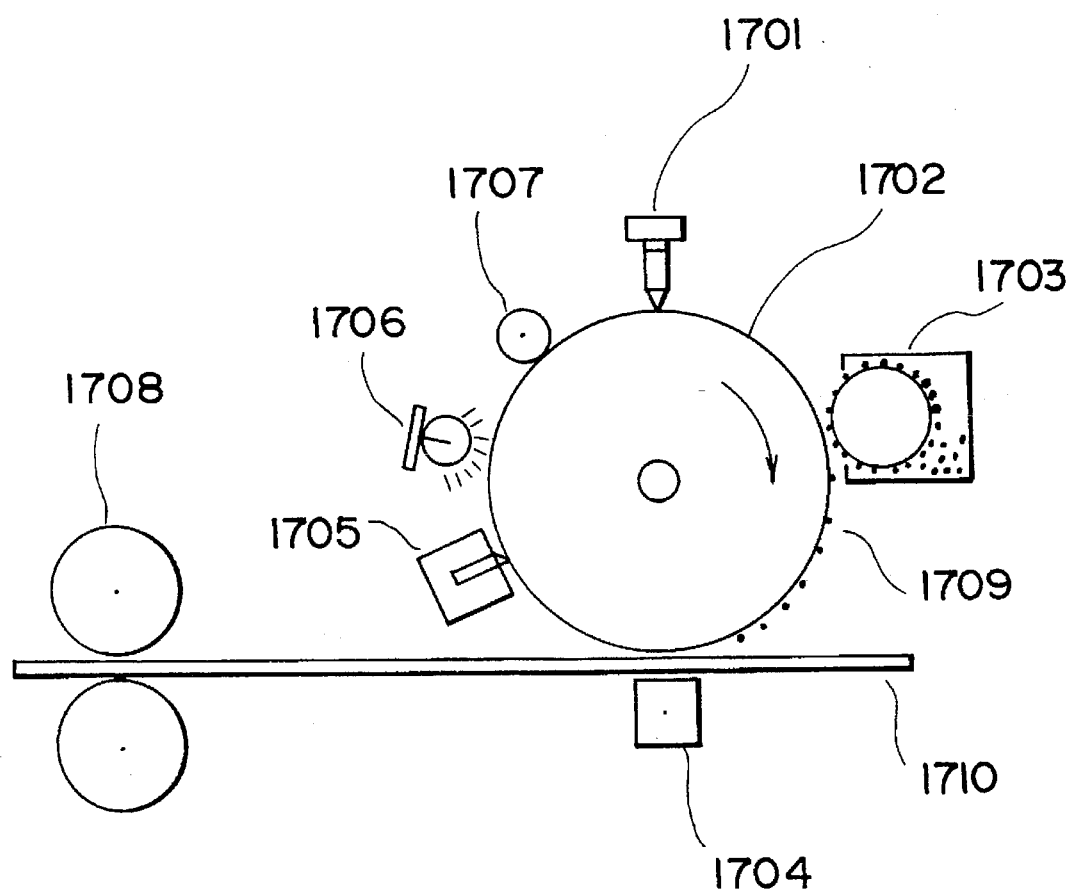
FIG. 17 is a schematic view of an LED printer employing the semiconductor device of the present invention.

LED arrays were formed by arranging 200 light-emitting devices obtained in each of the examples 1 to 4, at a pitch of 80 μm, and an LED printer of the structure shown in FIG. 17 was constructed with each of the above-mentioned LED arrays. In such LED printer, the LED devices were so wired that they could be independently driven. In FIG. 17, there are illustrated an LED array printing head 1701; a photosensitive drum 1702; a developing unit 1703; a transfer unit 1704; a cleaner 1705; a pre-exposure lamp 1706; a charging roller 1707; a fixing unit 1708; toner 1709; and a recording sheet 1710.

An image corresponding to electrical signals was formed on the recording sheet when this system was operated, thereby confirming that the LED's of the present invention can function as an optical printing head.

[EXAMPLE 10]

Figure 18:
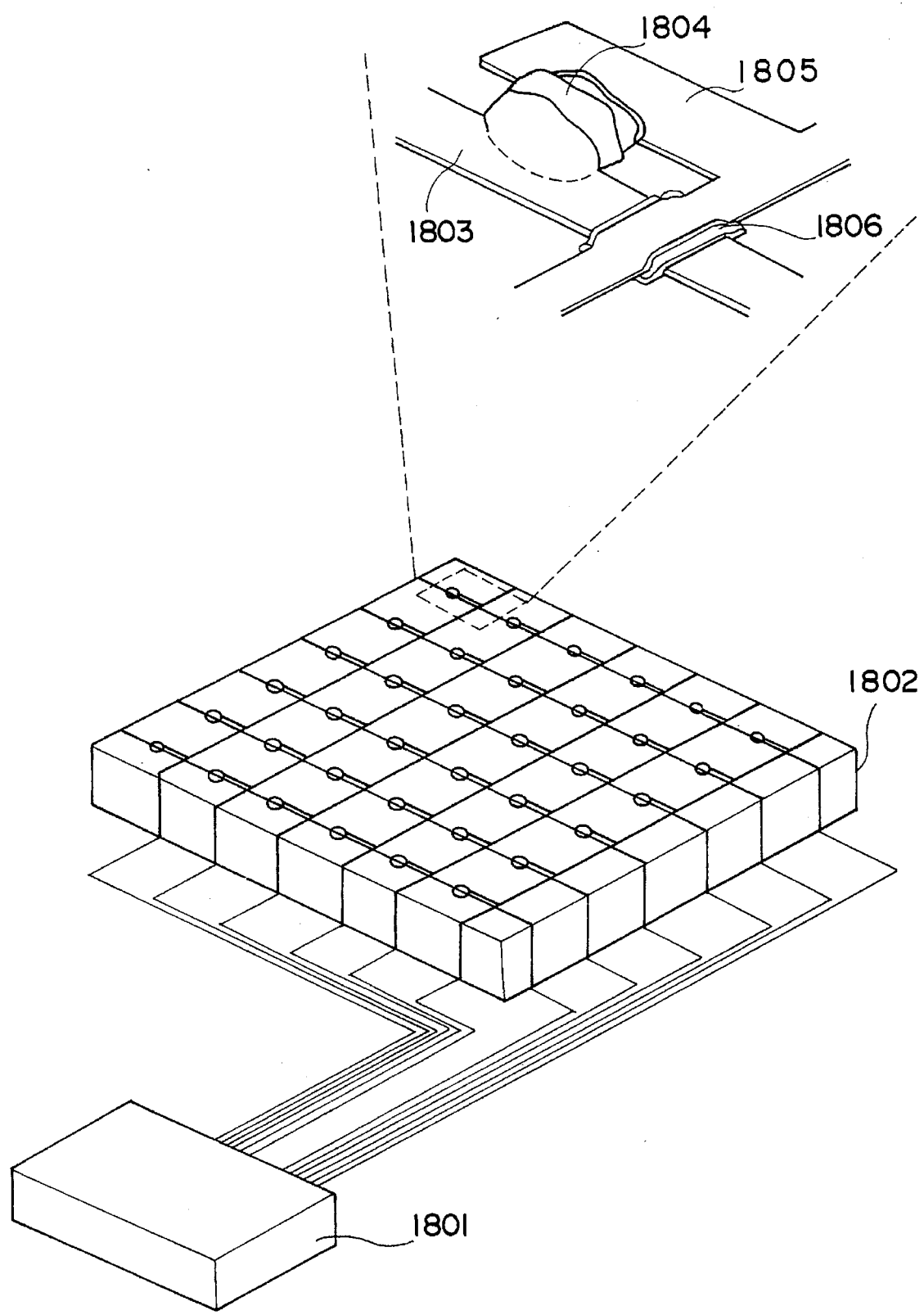
FIG. 18 is a schematic view of an LED display employing the semiconductor device of the present invention.
Figure 19:
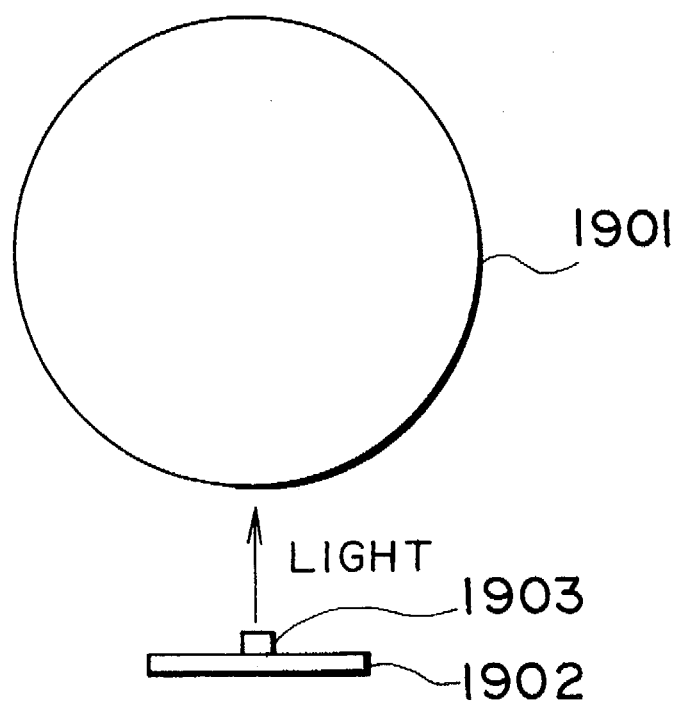
FIG. 19 is a schematic view of a conventional LED array head.

Red-color LED display units were prepared by arranging the LED devices, obtained in each of the examples 1 and 3, in a 6×6 matrix with a pitch of 1 mm, in which the LED devices were matrix wired to enable independent drive. FIG. 18 schematically illustrates the prepared display unit, wherein shown are a drive unit 1801; a ceramic substrate 1802; an n-electrode wiring 1803; a polycrystalline GaAs/AlGaAs 1804; a p-electrode wiring 1805; and a $SiO_2$ insulation film 1806.

An image was displayed according to electrical signals when this system is operated, thereby confirming that the LED's of the present invention can function as a display device.

What is claimed is:

1. A III-V compound semiconductor light emitting device, comprising a compound semiconductor of groups III-V of the periodic table with a polycrystalline structure of an average grain size of 0.6 μm or more; and wherein said III-V compound semiconductor comprises a p-n junction.

2. A semiconductor light emitting device according to claim 1, wherein said compound of groups III-V of the periodic table is selected from GaAs, GaAlAs and GaAsP.

3. An LED printer comprising:

an LED optical printer head comprising an LED array consisting of a plurality of group III-V compound semiconductor light emitting devices (LED), each of said plurality comprising a compound semiconductor of groups III-V of the periodic table with a polycrystalline structure of an average grain size of 0.6 μm or more wherein said plurality of group III-V compound semiconductor light-emitting devices are formed by joining different conductivity type semiconductor regions, and said group III-V compound semiconductor comprises a p-n junction;

(b) a photosensitive drum;
(c) a developing unit;
(d) a transfer unit;
(e) a cleaning unit;
(f) a pre-exposure lamp;
(g) a charging roller; and
(h) a fixing unit.

4. A III-V compound semiconductor light emitting device according to claim 3, wherein said compound of groups III-V of the periodic table is selected from GaAs, GaAlAs and GaAsP.

5. An LED printer comprising:
(a) an optical printer head comprising an array of a plurality of group III-V compound semiconductor light emitting devices, each of said devices having a polycrystalline structure of an average grain size of 0.6 μm or more, wherein said plurality of group III-V compound semiconductor light-emitting devices are formed by joining different conductivity type semiconductor regions, and are wired in a matrix so as to be independently drivable;

(b) a photosensitive drum;
(c) a developing unit;
(d) a transfer unit;
(e) a cleaning unit;
(f) a pre-exposure lamp;
(g) a charging roller; and
(h) a fixing unit.

* * * * *

UNITED STATES PATENT AND TRADEMARK OFFICE
CERTIFICATE OF CORRECTION

PATENT NO. : 5,659,184

DATED : August 19, 1997

INVENTOR(S): HIROYUKI TOKUNAGA ET AL.                Page 1 of 3

It is certified that error appears in the above-identified patent and that said Letters Patent is hereby corrected as shown below:

TITLE PAGE:

[56] REFERENCES CITED

Other Publications
      After "O.Paz et al.": "No. Feb. 15, 1987" should read --No. 4, Feb. 15, 1987.--.

COLUMN 1

Line 41, "been" should read --been reported regarding--.
   Line 50, "array head" should read --produced,--.

COLUMN 2

Line 67, "in" should read --in a--.

COLUMN 4

Line 51, "in" should read --in a--.

COLUMN 6

Line 8, "cyrstal" should read --crystal--.
   Line 65, "same" should read --the same--.

COLUMN 7

Line 5, "as" should read --as a--.
   Line 22, "Following" should read --The following--.
   Line 55, "surface in" should read --surface. In--.
   Line 66, "GainAsP)" should read --GaInAsP)--.

UNITED STATES PATENT AND TRADEMARK OFFICE
CERTIFICATE OF CORRECTION

PATENT NO. : 5,659,184

DATED : August 19, 1997

INVENTOR(S): HIROYUKI TOKUNAGA ET AL.

It is certified that error appears in the above-identified patent and that said Letters Patent is hereby corrected as shown below:

COLUMN 9

Line 59, "1402 For example" should read
    --1042, for example,--.
  Line 62, "composed for example" should read
    --composed, for example--.

COLUMN 10

Line 38, "forming n-" should read --forming an n---.

COLUMN 11

Line 31, "teperature" should read --temperature--.

COLUMN 12

Line 7, "ethcing" should read --etching--.

COLUMN 13

Line 22, "P-electordes" should read --P-electrodes--.

COLUMN 14

Line 7, "$SiH_{4(dopant)}$" should read --$SiH_4$ (dopant)--.

UNITED STATES PATENT AND TRADEMARK OFFICE
CERTIFICATE OF CORRECTION

PATENT NO. : 5,659,184

DATED : August 19, 1997

INVENTOR(S): HIROYUKI TOKUNAGA ET AL.

It is certified that error appears in the above-identified patent and that said Letters Patent is hereby corrected as shown below:

COLUMN 16

Line 34, "electrode" should read --electrodes--.
   Line 45, "electorde" should read --electrode--.
   Line 50, "prinding" should read --grinding--.

COLUMN 17

Line 1, "leaving" should read --leaving a--.
   line 39, "hte" should read --the--.

COLUMN 18

Line 56, "an LED optical" should read --(a) an LED
     optical--.
   Line 62, "more" should read --more,--.

Signed and Sealed this

Seventeenth Day of March, 1998

*Attest:*

BRUCE LEHMAN

*Attesting Officer*     *Commissioner of Patents and Trademarks*